(12) United States Patent
Wang et al.

(10) Patent No.: US 11,776,854 B2
(45) Date of Patent: *Oct. 3, 2023

(54) SEMICONDUCTOR STRUCTURE WITH HYBRID NANOSTRUCTURES

(71) Applicant: TAIWAN SEMICONDUCTOR MANUFACTURING COMPANY, LTD., Hsinchu (TW)

(72) Inventors: Pei-Hsun Wang, Kaohsiung (TW); Chun-Hsiung Lin, Zhubei (TW); Chih-Hao Wang, Baoshan Township, Hsinchu County (TW); Chih-Chao Chou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,219

(22) Filed: May 27, 2022

(65) Prior Publication Data

US 2022/0285222 A1    Sep. 8, 2022

Related U.S. Application Data

(63) Continuation of application No. 16/924,546, filed on Jul. 9, 2020, now Pat. No. 11,348,836, which is a
(Continued)

(51) Int. Cl.
*H01L 29/06* (2006.01)
*H01L 29/08* (2006.01)
(Continued)

(52) U.S. Cl.
CPC .. *H01L 21/823431* (2013.01); *H01L 21/3086* (2013.01); *H01L 21/823412* (2013.01); *H01L 21/823418* (2013.01); *H01L 21/823437* (2013.01); *H01L 21/823468* (2013.01); *H01L 21/823481* (2013.01); *H01L 27/0886* (2013.01); *H01L 29/0642* (2013.01); *H01L 29/16* (2013.01); *H01L 29/66545* (2013.01); *H01L 29/785* (2013.01); *H01L 2029/7858* (2013.01)

(58) Field of Classification Search
CPC combination set(s) only.
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,245,885 B1 * | 1/2016 | Xie ............... H01L 29/7851 |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Niki H Nguyen
(74) *Attorney, Agent, or Firm* — Birch, Stewart, Kolasch & Birch, LLP

(57) ABSTRACT

Semiconductor structures and methods for forming the same are provided. The semiconductor device includes a fin protruding from a substrate and an isolation structure surrounding the fin. The semiconductor device also includes a first channel layer and a second channel layer formed over the fin and at least partially overlapping the isolation structure. The semiconductor device further includes a gate structure formed in a space between the first channel layer and the second channel layer and wrapping around the first channel layer and the second channel layer.

20 Claims, 40 Drawing Sheets

Related U.S. Application Data continuation of application No. 16/284,113, filed on Feb. 25, 2019, now Pat. No. 10,727,134.

(60) Provisional application No. 62/752,693, filed on Oct. 30, 2018.

(51) Int. Cl.

| | |
|---|---|
| *H01L 31/0352* | (2006.01) |
| *H01L 21/8234* | (2006.01) |
| *H01L 29/16* | (2006.01) |
| *H01L 29/66* | (2006.01) |
| *H01L 29/78* | (2006.01) |
| *H01L 27/088* | (2006.01) |
| *H01L 21/308* | (2006.01) |

(56) References Cited

U.S. PATENT DOCUMENTS

| | | | |
|---|---|---|---|
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2* | 3/2017 | Ching ............... H01L 21/283 |
| 10,727,134 | B2* | 7/2020 | Wang ............... H01L 29/165 |
| 11,348,836 | B2* | 5/2022 | Wang ............... H01L 21/3086 |
| 2014/0183641 | A1* | 7/2014 | Fan ............... H01L 21/823878 |
| | | | 257/365 |
| 2017/0025535 | A1* | 1/2017 | Wu ............... H01L 29/785 |
| 2019/0341300 | A1* | 11/2019 | Glass ............... H01L 29/41791 |
| 2019/0348501 | A1* | 11/2019 | Glass ............... H01L 29/66795 |
| 2020/0058800 | A1* | 2/2020 | Wang ............... H01L 29/66795 |

\* cited by examiner

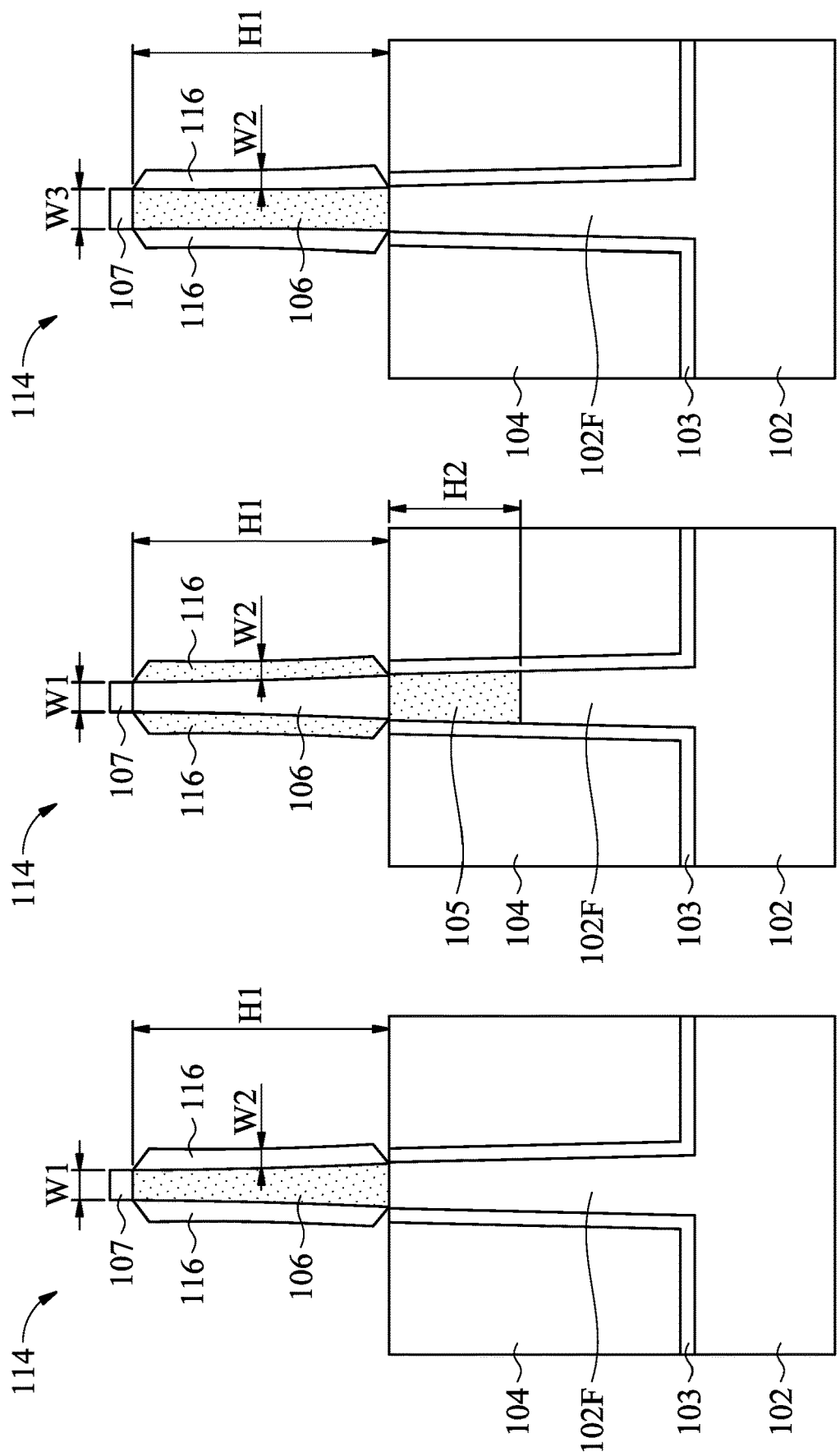

SEMICONDUCTOR STRUCTURE WITH HYBRID NANOSTRUCTURES

PRIORITY CLAIM AND CROSS-REFERENCE

This application is a Continuation application of U.S. patent application Ser. No. 16/924,546, filed on Jul. 9, 2020, which is a Continuation application of U.S. patent application Ser. No. 16/284,113, filed on Feb. 25, 2019, which claims the benefit of U.S. Provisional Application No. 62/752,693, filed on Oct. 30, 2018, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor integrated circuit (IC) industry has experienced exponential growth. Technological advances in IC materials and designs have produced generations of ICs where each generation has smaller and more complex circuits than the previous generation. As the semiconductor IC industry has progressed into nanometer process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in the fin channel and source/drain regions are formed. A gate structure is formed over and along the sides of the fin (e.g., wrapping) utilizing the advantage of the increased surface area of the channel to produce faster, more reliable, and better-controlled semiconductor transistor devices. However, there are still various challenges in the fabrication of FinFET devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 3A-1, 3A-2, 3A-3, 4A, 5A, 6A, 7A, 8A, 9A, 10A, 11A and 12A show cross-sectional views of respective intermediate structures at various stages of an exemplary method for fabricating a semiconductor device taken along line A-A in FIG. 1, in accordance with some embodiments.

DETAILED DESCRIPTION

Figure 1:
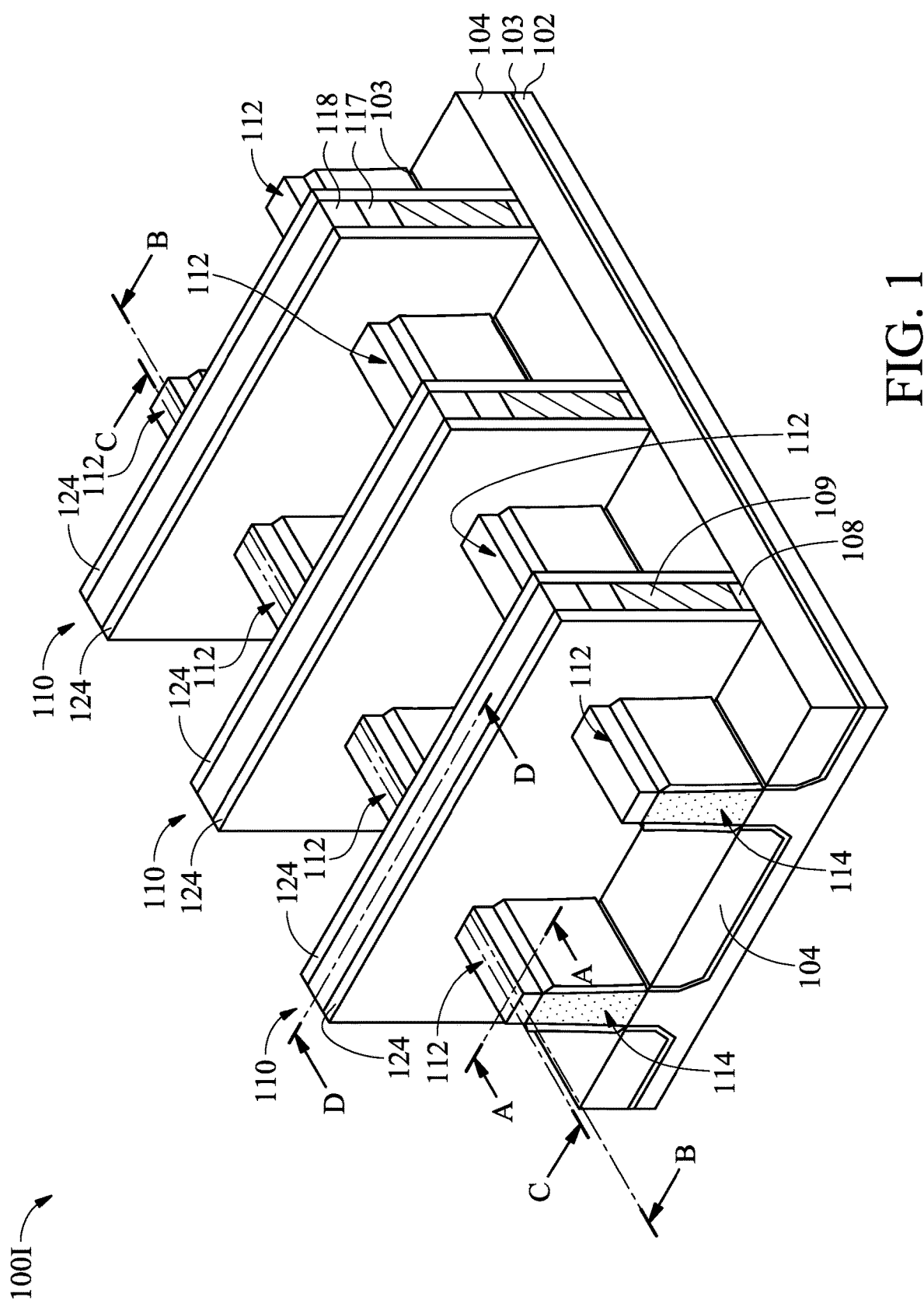
FIG. 1 shows a perspective view of an intermediate structure at one stage of an exemplary method for fabricating a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments disclosed herein relate generally to fabricating semiconductor devices with gate-all-around (GAA) structures. The semiconductor devices are for example Fin Field Effect Transistor (FinFET) devices. The GAA structures of the embodiments of the disclosure are formed by simpler processes than the conventional processes for forming a GAA structure. In some embodiments of the disclosure, a disposable mandrel fin is formed on a fin, and channel fins are epitaxially grown on the sidewalls of the disposable mandrel fin. Afterwards, the disposable mandrel fin is removed to form a space between the channel fins. Then, a gate structure is formed to fill the space between the channel fins and to wrap the channel fins to form a GAA structure. In the embodiments of the disclosure, the channel fins are disposed vertically on the top surface of the fin of the semiconductor device and the GAA structure is formed surrounding the vertical channel fins.

According to embodiments of the disclosure, the space between the channel fins can be defined by the width of the disposable mandrel fin. Therefore, the space between the channel fins is flexible and may be reduced to be smaller than 10 nm. The threshold voltage (Vt) of the FinFET devices of the disclosure can be flexibly controlled due to the space between the channel fins in the GAA structure is flexible. Moreover, according to the embodiments of the disclosure, in the processes of forming the GAA structure, the gate structure is easy to fill the space between the channel fins and to wrap the channel fins.

The foregoing broadly outlines some aspects of the embodiments described herein. Some embodiments described herein are described in the context of FinFET devices, and more particularly, in the context of forming GAA structures in FinFET devices. Some variations of the exemplary methods and structures are described. A person having ordinary skill in the art will readily understand other modifications may be made that are contemplated within the scope of other embodiments. Implementations of some aspects of the present disclosure may be used in other processes and/or in other devices. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 illustrates a perspective (three-dimensional) view of an intermediate structure at one stage of an exemplary method for fabricating a semiconductor device with a GAA structure, in accordance with some embodiments. The intermediate structure of FIG. 1 is a semiconductor device 100I such as simplified FinFETs with dummy gate structures 110. Other aspects not illustrated in or described with respect to FIG. 1 may become apparent from the following figures and description. The structure in FIG. 1 may be electrically connected or coupled in a manner to operate as, for example, one transistor or more, such as six transistors.

The semiconductor device 100I includes multiple fin structures 114 protruding from a semiconductor substrate 102. The semiconductor substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The semiconductor substrate 102 may be made of silicon or another semiconductor material. For example, the semiconductor substrate 102 is a silicon wafer. In some examples, the semiconductor substrate 102 may be made of a compound semiconductor such as silicon germanium or another suitable compound semiconductor material.

Multiple isolation structures 104 are formed on the semiconductor substrate 102, and each of the fin structures 114 protrudes above the isolation structures 104 and is surrounded by the isolation structures 104, as shown in FIG. 1 in accordance with some embodiments. The isolation structure 104 is, for example a shallow-trench-isolation (STI) structure, which surrounds the bottom portions of the fin structures 114. The isolation structure 104 is disposed between neighboring pairs of the fin structures 114. The isolation structure 104 is formed from an insulating material such as silicon oxide, silicon nitride, silicon oxynitride, fluoride-doped silicate glass (FSG), or another low dielectric constant (low-k) dielectric material. The isolation structure 104 may be formed by filling trenches between the fin structures 114 with the insulating material using a deposition process, such as chemical vapor deposition (CVD) process, flowable CVD (FCVD) process, spin-on-glass (SOG) process, or another applicable process.

In addition, a liner 103 is formed between the isolation structures 104 and the semiconductor substrate 102. The liner 103 is conformally deposited on the sidewalls of the bottom portions of the fin structures 114, and is disposed between the isolation structures 104 and the bottom portions of the fin structures 114. The material of the liner 103 may be silicon oxide, silicon nitride or silicon oxynitride. The liner 103 may be deposited using CVD process, physical vapor deposition (PVD) process or atomic layer deposition (ALD) process. Details of the processes and the configurations for forming the fin structures 114 are described below in reference to the cross-sectional views of FIGS. 2A-1, 3A-1, 3A-2 and 3A-3.

Multiple dummy gate structures 110 are formed across the fin structures 114, along the sidewalls and over the top surfaces of the fin structures 114, as shown in FIG. 1 in accordance with some embodiments. Furthermore, the dummy gate structures 110 are formed on the isolation structures 104. The longitudinal direction of the dummy gate structures 110 is perpendicular to the longitudinal direction of the fin structures 114. In some embodiments of the disclosure, each of the dummy gate structures 110 will be replaced with a replacement gate structure in a gate-last process to form a gate-all-around (GAA) structure.

Each of the dummy gate structures 110 includes a dummy gate dielectric layer 108 and a dummy gate electrode layer 109 over the dummy gate dielectric layer 108. In some embodiments, the dummy gate electrode layer 109 is made of poly-silicon. The dummy gate dielectric layer 108 may be made of silicon oxide, silicon nitride, silicon oxynitride or another low dielectric constant (low-k) dielectric material. The dummy gate dielectric layer 108 and the dummy gate electrode layer 109 are formed independently using a deposition process, such as CVD, PVD, ALD, high density plasma CVD (HDPCVD), metal organic CVD (MOCVD), or plasma enhanced CVD (PECVD) process. Then, those deposited layers of the dummy gate dielectric layer 108 and the dummy gate electrode layer 109 are patterned into the dummy gate structures 110 using photolithography and etching processes. The etching process is anisotropic and may include a reactive ion etch (RIE), neutral beam etch (NBE), or another suitable etching process.

Gate spacers 124 are formed along the sidewalls of the dummy gate structures 110 and over the fin structures 114. The gate spacers 124 are also formed on the isolation structures 104. The gate spacers 124 may be formed by conformally depositing one or more gate spacer material layers and anisotropically etching the one or more gate spacer material layers. The one or more gate spacer material layers may include silicon oxide ($SiO_2$), silicon nitride (SiN or $Si_3N_4$), silicon oxynitride (SiON), silicon carbon nitride (SiCN), or a combination thereof, and may be deposited by CVD, ALD or another deposition process. The etching process may include a RIE, NBE, or another etching process.

Details of the processes for forming the dummy gate structures 110 and the gate spacers 124 are described below in reference to the cross-sectional views shown in FIGS. 4A-4D and 5A-5D.

Source and drain regions 112 are formed in active areas of the fin structures 114, on opposite sides of the dummy gate structure 110, as shown in FIG. 1 in accordance with some embodiments. Some source and drain regions 112 may be shared between two neighboring transistors, such as through coalescing the regions by epitaxial growth. For example, the neighboring FinFETs with the shared source and drain regions may be implemented as two functional transistors. Other configurations in other examples may implement other numbers of functional transistors. In some embodiments, the source and drain regions 112 are epitaxial source and drain structures. Details of the processes for forming epitaxial source and drain structures as the source and drain regions 112 are described below in reference to the cross-sectional views shown in FIGS. 5A-5D and 8A-8D.

FIG. 1 illustrates a reference cross-section along line A-A that is used in FIGS. 2A-1, 2A-2, 3A-1, 3A-2, 3A-3, 4A, 5A, 6A, 7A, 8A, 9A, 10A, 11A and 12A. Line A-A is on a plane that is perpendicular to the fin structure 114 and over the isolation structures 104. FIG. 1 also illustrates a reference cross-section along line B-B that is used in FIGS. 4B, 5B, 6B, 7B, 8B, 9B, 10B, 11B and 12B. Line B-B is on a plane that is perpendicular to the dummy gate structure 110 and along the center region of the fin structure 114. FIG. 1 further illustrates a reference cross-section along line C-C that is used in FIGS. 4C, 5C, 6C, 7C, 8C, 9C, 10C, 11C and 12C. Line C-C is on a plane that is perpendicular to the dummy gate structure 110, along the peripheral region of the fin structure 114 and over the liner 103. In addition, FIG. 1 illustrates a reference cross-section along line D-D that is used in FIGS. 4D, 5D, 6D, 7D, 8D, 9D, 10D, 11D and 12D. Line D-D is on a plane that is along the dummy gate structure 110 and over the fin structure 114 and the isolation structures 104.

In FIG. 1, for ease of depicting the figure, some components or features (for example, a contact etch stop layer and an interlayer dielectric layer) illustrated in the following figures are omitted to avoid obscuring other components or features. In addition, the details of the fin structures 114, the gate spacers 124, epitaxial source and drain structures formed in the source and drain regions 112 and other features used is the processes for fabricating semiconductor devices with GAA structures are simplified. Details of the materials and processes for fabricating the semiconductor devices with GAA structures according to embodiments of the disclosure are described below.

Figures 2, 2A:
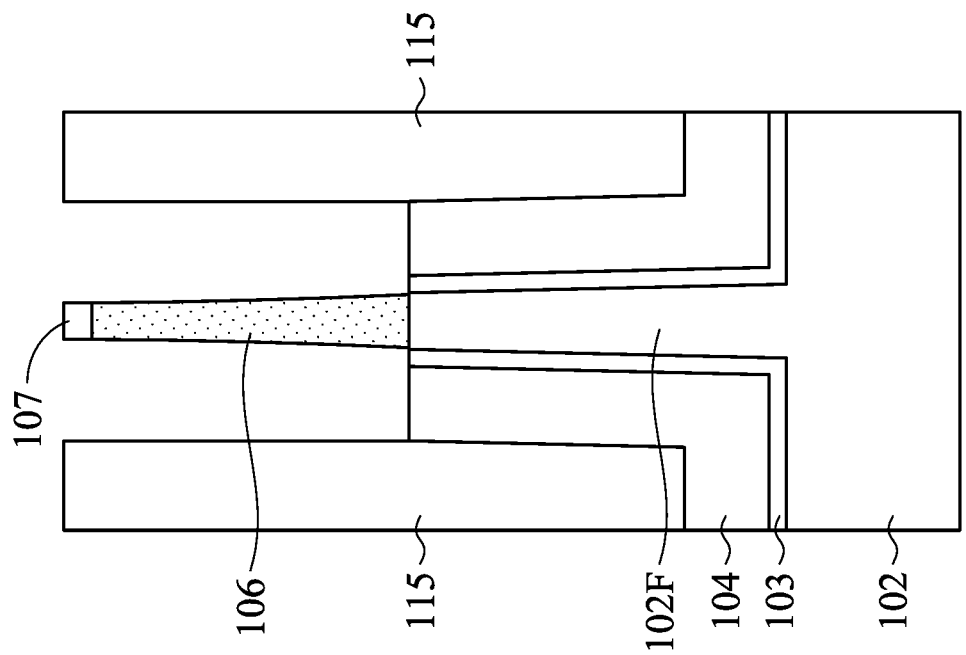
Figures 1, 2A:
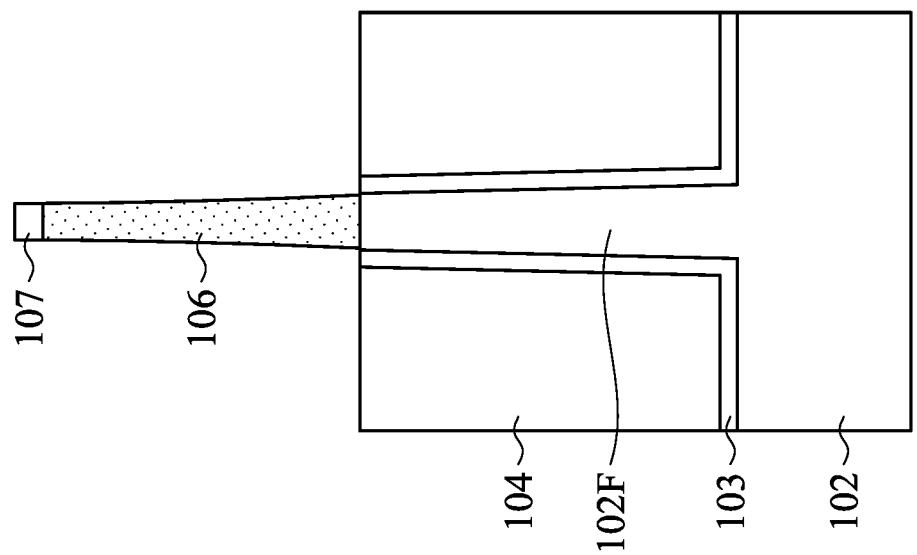

FIG. 2A-1 illustrates a cross-sectional view of an intermediate structure at one stage of fabricating a semiconductor device taken along line A-A in FIG. 1, in accordance with some embodiments. Firstly, a semiconductor substrate 102 such as a silicon wafer is provided. A semiconductor material layer for forming disposable mandrel fins 106 is then blanketly deposited on the semiconductor substrate 102. The semiconductor material of the disposable mandrel fins 106 is different from that of the semiconductor substrate 102. In some embodiments, the semiconductor substrate 102 is made of Si, and the disposable mandrel fins 106 are made of SiGe, or an III-V compound semiconductor. In some example, the disposable mandrel fin 106 is made of InAs, AlAs, GaAs, InP, GaN, InGaAs, InAlAs, GaSb, AlSb, AlP, GaP, GaAsP, AlGaAs, GaInP or GaInAsP.

Next, the semiconductor substrate 102 and the semiconductor material layer thereon are patterned together using photolithography and etching processes to form multiple trenches in the semiconductor substrate 102 and the semiconductor material layer. The etching process for forming the disposable mandrel fins 106 and the fins 102F may include a reactive ion etch (RIE), neutral beam etch (NBE), inductive coupled plasma (ICP) etch, or a combination thereof. A hard mask 107 is patterned and formed on the semiconductor material layer of the disposable mandrel fins 106. The hard mask 107 is used as an etching mask in the etching process to form the disposable mandrel fins 106 and the fins 102F. The hard mask 107 is formed through depositing a hard mask layer and patterning the hard mask layer using photolithography and etching processes. The hard mask 107 may be made of silicon oxide, silicon nitride, silicon oxynitride, silicon carbide, silicon carbon nitride, or a combination thereof. The hard mask layer may be deposited using CVD, PVD, ALD or another suitable deposition process.

Thereafter, the fins 102F and the disposable mandrel fins 106 on the fins 102F are formed and protrude from the semiconductor substrate 102. The widths of the disposable mandrel fin 106 and the fin 102F are determined by the width of the hard mask 107. Each of the trenches is between neighboring pairs of the fins 102F and between neighboring pairs of the disposable mandrel fins 106.

Next, a liner material layer is conformally deposited in the trenches, on the semiconductor substrate 102 and along the sidewalls of the fins 102F and the disposable mandrel fins 106 and on the top surfaces of the hard mask 107. The liner material layer may be made of silicon oxide, silicon nitride or silicon oxynitride. The liner material layer may be deposited using CVD, PVD or ALD process.

Afterwards, the trenches between the fins 102F and between the disposable mandrel fins 106 are filled with an insulating material on the liner material layer. In some examples, the insulating material is for example silicon oxide, silicon nitride, silicon oxynitride, fluoride-doped silicate glass (FSG), or another low dielectric constant (low-k) dielectric material. The trenches may be filled with the insulating material using a deposition process, such as CVD, flowable CVD (FCVD), spin-on-glass (SOG) process, or another applicable process.

After the deposition process, the insulating material and the liner material layer are recessed using an etching process to form an isolation structure 104 and the liner 103, as shown in FIG. 2A-1 in accordance with some embodiments. The isolation structure 104 is for example a shallow-trench-isolation (STI) structure that surrounds the fin 102F. The top surfaces of the isolation structure 104 and the liner 103 may be higher than, lower than or at the same level with the top surface of the fin 102F.

FIG. 2A-2 illustrates a cross-sectional view of an intermediate structure at one stage of fabricating a semiconductor device taken along line A-A in FIG. 1, in accordance with some other embodiments. The difference between the embodiments of FIGS. 2A-2 and 2A-1 is that an isolation fin 115 is formed in the isolation structure 104. The isolation fin 115 can provide an additional isolation for the disposable mandrel fin 106 and later for source and drain epitaxial (S/D EPI) structures isolation. The isolation fin 115 has a lower portion embedded in the isolation structure 104 and an upper portion protruding from the isolation structure 104. The isolation fin 115 is parallel to the fin 102F and the disposable mandrel fin 106. The isolation fin 115 is made of a dielectric material, for example silicon oxide, silicon nitride or silicon oxynitride. The isolation fin 115 may be formed using photolithography, etching and deposition processes. The top surface of the isolation fin 115 may be in the same level with the top surface of the hard mask 107.

FIG. 3A-1 illustrates a cross-sectional view of an intermediate structure at one stage of fabricating a semiconductor device following FIG. 2A-1, which is taken along line A-A in FIG. 1, in accordance with some embodiments. Multiple channel fins 116 are formed using an epitaxial growth process on the sidewalls of the disposable mandrel fin 106. The portions of the channel feature 116 close to the top surface and the bottom surface of the disposable mandrel fin 106 may have inclined planes to the sidewall of the disposable mandrel fin 106. There may be a space between the lower inclined plane of the channel feature 116 and the liner 103.

In some embodiments, the channel fins 116 are made of a semiconductor material that is different from the semiconductor material of the disposable mandrel fin 106. The semiconductor material of the channel fins 116 may be the same as that of the fin 102F. In some embodiments, the channel fins 116 and the fin 102F are made of Si, and the disposable mandrel fin 106 is made of SiGe. The fin 102F, the disposable mandrel fin 106 and the channel fins 116 are together referred to as the fin structure 114 of FIG. 1. In some examples, the disposable mandrel fin 106 has a width W1 that is in a range from about 5 nm to about 10 nm. Each of the channel fins 116 has a width W2 that is in a range from about 5 nm to about 10 nm. The disposable mandrel fin 106 and the channel fins 116 have a height H1 that is in a range from about 30 nm to about 60 nm.

The width W1 of the disposable mandrel fin 106 may be determined by the width of the hard mask 107 thereon. In some examples, the width W1 of the disposable mandrel fin 106 may be in a range from about 5 nm to about 10 nm for a metal gate filling process window. The width W2 of the channel fins 116 may be determined by the process time of the epitaxial growth process for forming the channel fins 116. In some examples, the width W2 of the channel fins 116 may be in a range from about 5 nm to about 10 nm for channel design of the semiconductor devices.

FIG. 3A-2 illustrates a cross-sectional view of an intermediate structure at one stage of fabricating a semiconductor device, which is taken along line A-A in FIG. 1, in accordance with some other embodiments. Firstly, the fin 102F is formed and surrounded by the isolation structure 104 as those described above with respect to FIG. 2A-1. Next, an upper portion of the fin 102F is removed using an etching process to form a recess in the isolation structure 104 and surrounded by the liner 103. Thereafter, a buffer portion 105 is formed in the recess. In some embodiments, the buffer portion 105 is made of a semiconductor material that is different from the semiconductor material of the fin 102F. The semiconductor material of the buffer portion 105 may be SiGe or an III-V compound semiconductor, for example InAs, AlAs, GaAs, InP, GaN, InGaAs, InAlAs, GaSb, AlSb, AlP, GaP, GaAsP, AlGaAs, GaInP or GaInAsP. The buffer portion 105 may be formed using epitaxial growth and planarization processes. The top surface of the buffer portion 105 may be coplanar with the top surfaces of the isolation structure 104 and the liner 103.

Afterwards, a disposable mandrel fin 106 is formed on the buffer portion 105. In some embodiments, the disposable mandrel fin 106 is made of a semiconductor material that is the same as the semiconductor material of the fin 102F and different from the semiconductor material of the buffer portion 105. The disposable mandrel fin 106 may be formed using deposition, photolithography and etching processes. The width W1 of the disposable mandrel fin 106 is determined by the width of the hard mask 107 thereon. The hard mask 107 is used as an etching mask in the etching process for forming the disposable mandrel fin 106.

Next, channel fins 116 are formed using an epitaxial growth process on the sidewalls of the disposable mandrel fin 106. The channel feature 116 may have inclined planes close to the top surface and the bottom surface of the disposable mandrel fin 106. In some embodiments, the channel fins 116 are made of a semiconductor material that is different from the semiconductor material of the disposable mandrel fin 106. The semiconductor material of the channel fins 116 may be the same as that of the buffer portion 105. The semiconductor material of the channel fins 116 may be SiGe, a P-type fully strained channel (PFSC) material, or an III-V compound semiconductor, for example InAs, AlAs, GaAs, InP, GaN, InGaAs, InAlAs, GaSb, AlSb, AlP, GaP, GaAsP, AlGaAs, GaInP or GaInAsP. In some embodiments, the disposable mandrel fin 106 and the fin 102F are made of Si, and the channel fins 116 and the buffer portion 105 are made of SiGe.

The fin 102F, the buffer portion 105, the disposable mandrel fin 106 and the channel fins 116 are together referred to as the fin structure 114 of FIG. 1. In some examples, the disposable mandrel fin 106 has a width W1 that is in a range from about 5 nm to about 10 nm. The channel fins 116 have a width W2 that is in a range from about 5 nm to about 10 nm. The disposable mandrel fin 106 and the channel fins 116 have a height H1 that is in a range from about 30 nm to about 60 nm. The buffer portion 105 has a height H2 that is in a range from about 10 nm to about 30 nm. In some other examples, the width W1 of the disposable mandrel fin 106 may be smaller than about 5 nm. In some other examples, the width W2 of the channel fins 116 may be smaller than about 5 nm.

FIG. 3A-3 illustrates a cross-sectional view of an intermediate structure at one stage of fabricating a semiconductor device, which is taken along line A-A in FIG. 1, in accordance with some other embodiments. The difference between the embodiments of FIGS. 3A-3 and 3A-1 is that the disposable mandrel fin 106 of FIG. 3A-3 has a width W3 that is different from the width W1 of the disposable mandrel fin 106 of FIG. 3A-1. The W3 of the disposable mandrel fin 106 is determined by the width of the hard mask 107 of FIG. 3A-3.

In some examples, the width W3 of the disposable mandrel fin 106 of FIG. 3A-3 is larger than the width W1 of the disposable mandrel fin 106 of FIG. 3A-1. The width W3 of the disposable mandrel fin 106 may be in a range from about 10 nm to about 20 nm. According to the embodiments of the disclosure, the width of the disposable mandrel fin 106 is flexible and can be defined by the width of the hard mask 107 thereon. In addition, the materials and the processes for forming the disposable mandrel fin 106, the patterned hard mask 107 and the channel fins 116 in the embodiments of FIG. 3A-3 may be the same as or similar to those described with respect to FIG. 3A-1.

Figure 4A:
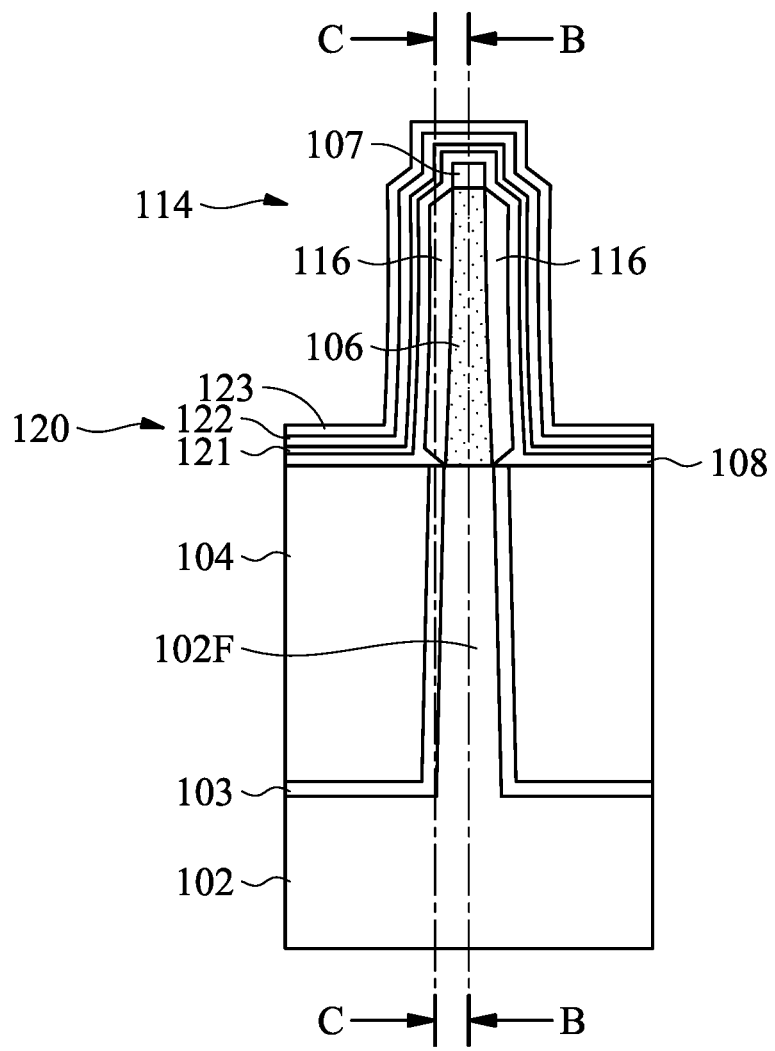
Figure 4B:
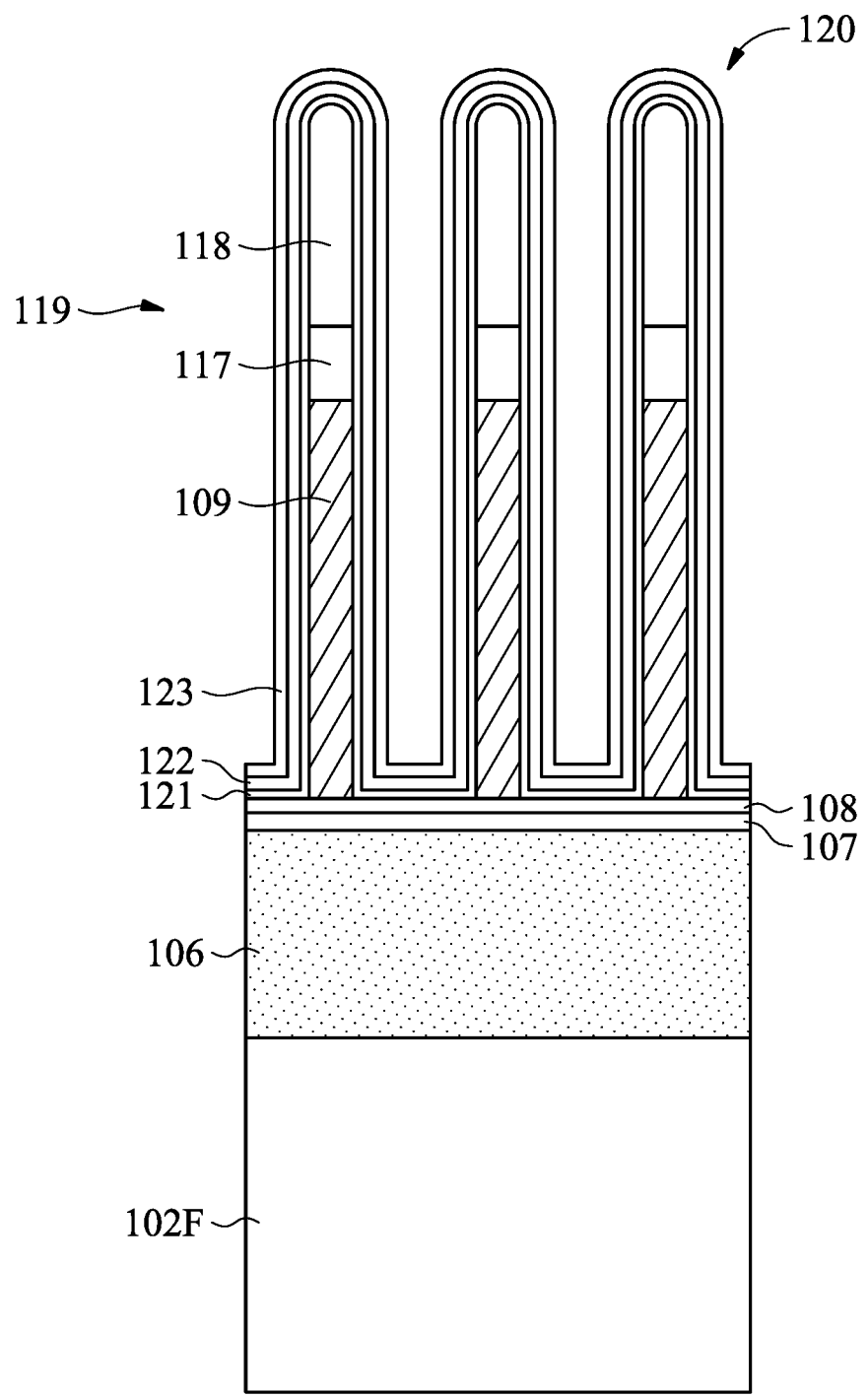
FIGS. 4B, 5B, 6B, 7B, 8B, 9B, 10B, 11B and 12B show cross-sectional views of respective intermediate structures at various stages of an exemplary method for fabricating a semiconductor device taken along line B-B in FIG. 1, in accordance with some embodiments.

FIGS. 4A, 4B, 4C and 4D illustrate cross-sectional views of an intermediate structure at one stage of fabricating a semiconductor device following FIG. 2A-1, which are taken along line A-A, line B-B, line C-C and line D-D in FIG. 1, respectively, in accordance with some embodiments. Referring to FIG. 4B, a dummy gate dielectric layer 108 is deposited on the hard mask 107 and over the disposable mandrel fin 106 in accordance with some embodiments. Then, a dummy gate electrode layer 109 is deposited on the dummy gate dielectric layer 108. In some examples, the hard mask 107 is made of silicon nitride, the dummy gate dielectric layer 108 is made of silicon oxide, and the dummy gate electrode layer 109 is made of poly-silicon.

Next, a first hard mask 117 and a second hard mask 118 are patterned and formed on the dummy gate electrode layer 109. The first hard mask 117 and the second hard mask 118 are used as an etching mask in an etching process for forming the pattern of the dummy gate electrode layer 109. The first hard mask 117 and the second hard mask 118 are together referred to as a hard mask structure 119 for the dummy gate electrode layer 109. In some examples, the first hard mask 117 is made of silicon carbon nitride (SiCN), silicon oxycarbide (SiOC), silicon oxycarbon nitride (SiOCN) or silicon nitride (SiN or $Si_3N_4$). The second hard mask 118 may be made of silicon oxide ($SiO_2$). The first hard mask 117 and the second hard mask 118 are formed using deposition, photolithography and etching processes. The deposition process may include CVD, PVD or another deposition process. The etching process may include a RIE, NBE, or another etching process.

Afterwards, a gate spacer material layer 120 is conformally deposited on the second hard mask 118, along the sidewalls of the second hard mask 118, the first hard mask 117 and the dummy gate electrode layer 109, and also on the dummy gate dielectric layer 108. The gate spacer material layer 120 may include one or more spacer layers. In some instances, the gate spacer material layer 120 is a multiple-layered structure such as a three-layered structure that includes a first spacer layer 121, a second spacer layer 122 and a third spacer layer 123 deposited in sequence. The materials of the first spacer layer 121, the second spacer layer 122 and the third spacer layer 123 may be different from each other.

In some examples, the first spacer layer 121 is made of a low dielectric constant (low-k) dielectric material that has a k-value lower than the k-value (about 3.9) of $SiO_2$. The material of the first spacer layer 121 includes silicon nitride (SiN or $Si_3N_4$), silicon carbon nitride (SiCN), silicon oxynitride (SiON), silicon oxycarbide (SiOC) or silicon oxycarbon nitride (SiOCN). In some examples, the first spacer layer 121 has a thickness that is in a range from about 1 nm to about 2 nm.

The material of the second spacer layer 122 includes silicon oxide ($SiO_2$) or silicon oxycarbon nitride (SiOCN). In some examples, the second spacer layer 122 has a thickness that is in a range from about 2 nm to about 3 nm. The material of the third spacer layer 123 includes silicon nitride (SiN or $Si_3N_4$) or silicon carbon nitride (SiCN). In some examples, the third spacer layer 123 has a thickness that is in a range from about 6 nm to about 8 nm. The first spacer layer 121, the second spacer layer 122 and the third spacer layer 123 may be deposited respectively by CVD, PECVD, ALD or another deposition process.

Figure 4C:
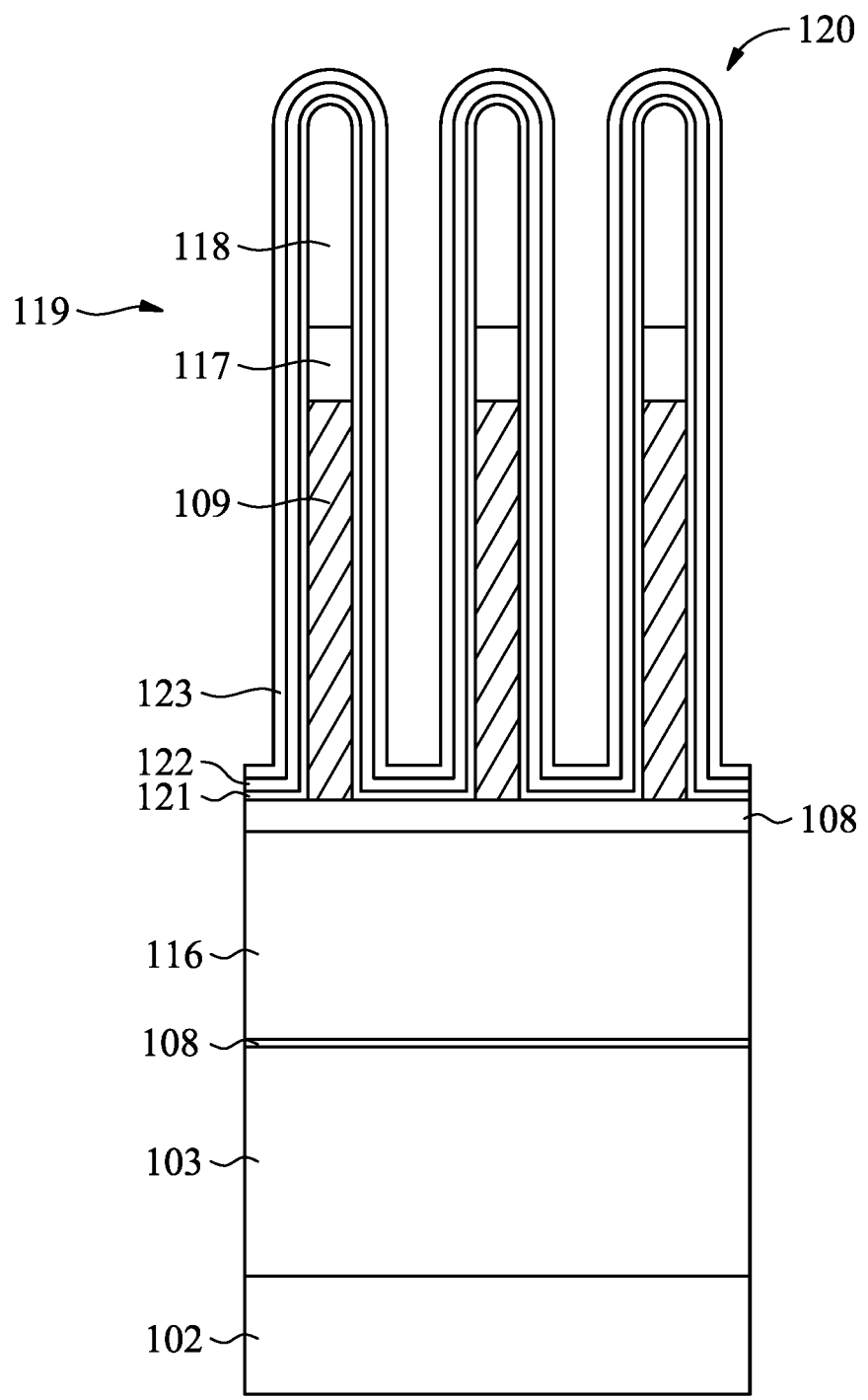
FIGS. 4C, 5C, 6C, 7C, 8C, 9C, 10C, 11C, and 12C show cross-sectional views of respective intermediate structures at various stages of an exemplary method for fabricating a semiconductor device taken along line C-C in FIG. 1, in accordance with some embodiments.

Referring to FIG. 4C, the dummy gate dielectric layer 108 is deposited on the channel fins 116 and over the liner 103, in accordance with some embodiments. The dummy gate electrode layer 109 is then formed on the dummy gate dielectric layer 108. The first hard mask 117 and the second hard mask 118 are formed on the dummy gate electrode layer 109. Moreover, the gate spacer material layer 120 is conformally deposited on the second hard mask 118, along the sidewalls of the second hard mask 118, the first hard mask 117 and the dummy gate electrode layer 109, and also on the dummy gate dielectric layer 108. The materials and the processes for forming the dummy gate dielectric layer 108, the dummy gate electrode layer 109, the first hard mask 117, the second hard mask 118 and the gate spacer material layer 120 are the same as those described with respect to FIG. 4B.

In some embodiments, the dummy gate dielectric layer 108 is not patterned together with the dummy gate electrode layer 109. The dummy gate dielectric layer 108 remains on the hard mask 107, along the sidewalls of the channel fins 116 and on the top surfaces of the liner 103 and the isolation structure 104, as shown in FIG. 4A in accordance with some embodiments. The gate spacer material layer 120 is conformally deposited on the dummy gate dielectric layer 108. The dummy gate dielectric layer 108 is patterned together with the gate spacers 124 in a later process. In some other embodiments, the dummy gate dielectric layer 108 and the dummy gate electrode layer 109 are patterned together. The dummy gate dielectric layer 108 at the source and drain regions 112 (FIG. 1) is removed after the dummy gate electrode layer 109 and the dummy gate dielectric layer 108 are patterned. The gate spacer material layer 120 may be directly deposited on the channel fins 116, the hard mask 107 over the disposable mandrel fin 106 at the source and drain regions 112 (FIG. 1) and on the liner 103 and the isolation structures 104. The materials and the processes for forming the gate spacer material layer 120 are the same as those described with respect to FIG. 4B. In addition, FIG. 4A illustrates a reference cross-section along line B-B that is on the same plane used in FIGS. 4B, 5B, 6B, 7B, 8B, 9B, 10B, 11B and 12B. Line B-B is on a plane that passes through the disposable mandrel fin 106. FIG. 4A further illustrates a reference cross-section along line C-C that is on the same plane used in FIGS. 4C, 5C, 6C, 7C, 8C, 9C, 10C, 11C and 12C. Line C-C is on a plane that passes through the channel fin 116.

Figure 4D:
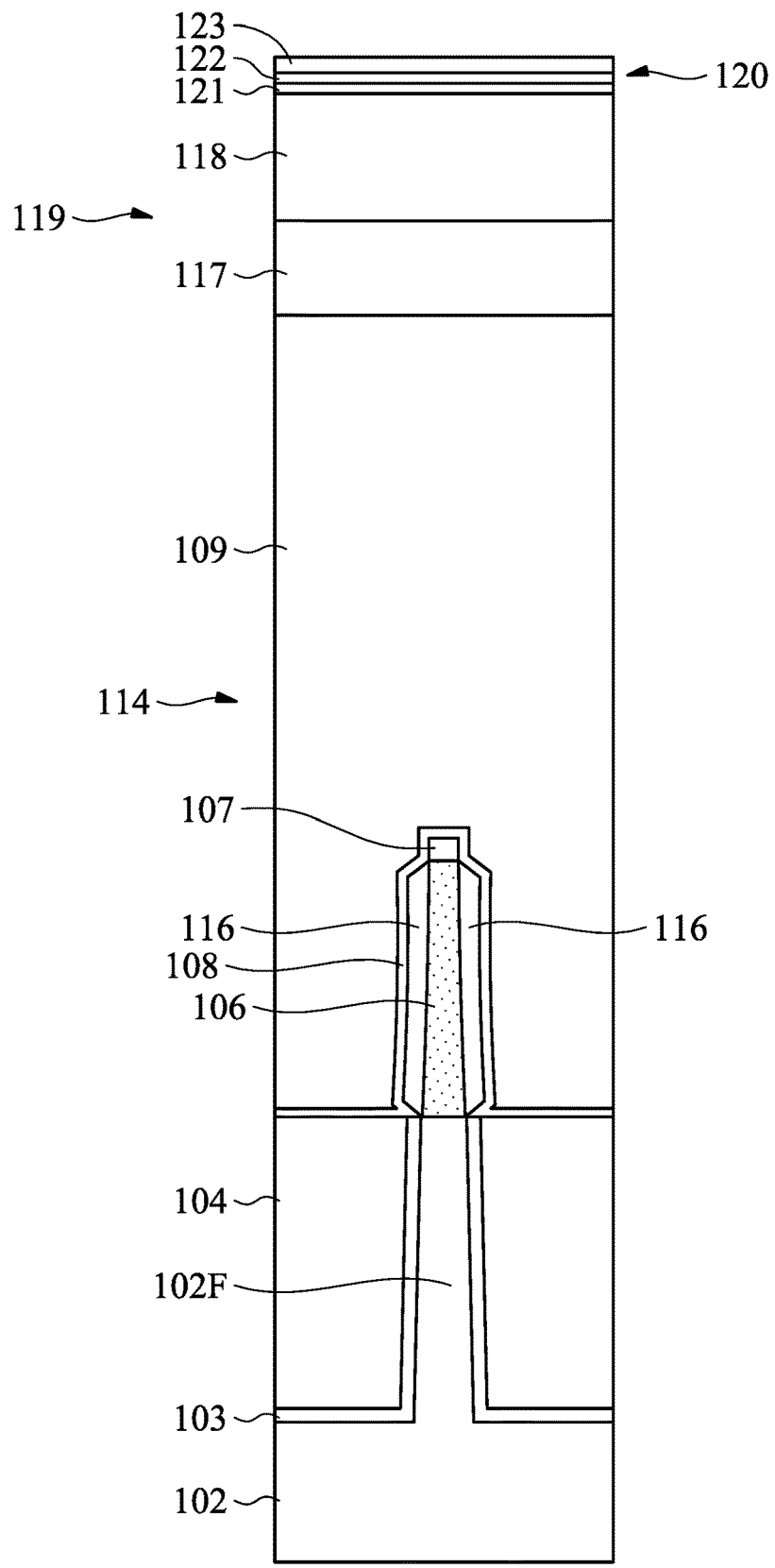
FIGS. 4D, 5D, 6D, 7D, 8D, 9D, 10D, 11D and 12D show cross-sectional views of respective intermediate structures at various stages of an exemplary method for fabricating a semiconductor device taken along line D-D in FIG. 1, in accordance with some embodiments.

Referring to FIG. 4D, the dummy gate dielectric layer 108 is conformally deposited on the hard mask 107, along the sidewalls of the channel fins 116 and on the liner 103 and the isolation structure 104, in accordance with some embodiments. The dummy gate electrode layer 109 is then formed on the dummy gate dielectric layer 108. The first hard mask 117 and the second hard mask 118 are formed on the dummy gate electrode layer 109. Moreover, the gate spacer material layer 120 is deposited on the second hard mask 118. The materials and the processes for forming the dummy gate dielectric layer 108, the dummy gate electrode layer 109, the first hard mask 117, the second hard mask 118 and the gate spacer material layer 120 are the same as those described with respect to FIG. 4B.

Figure 5A:
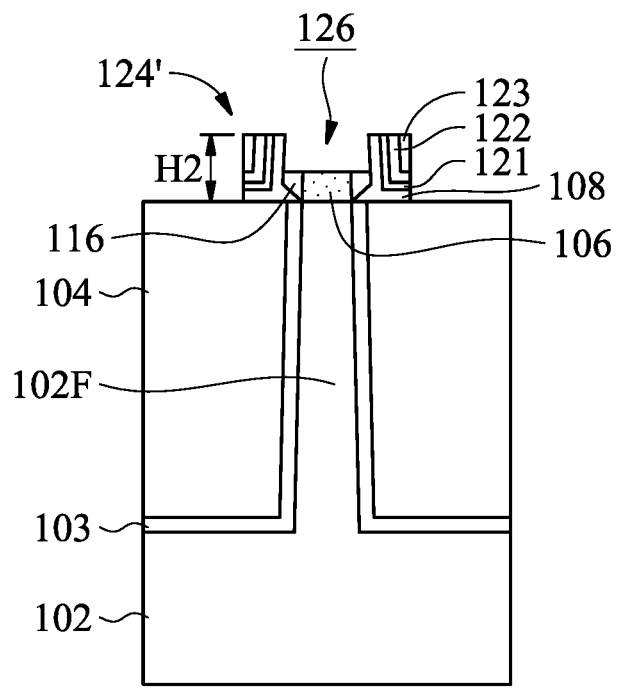
Figure 5B:
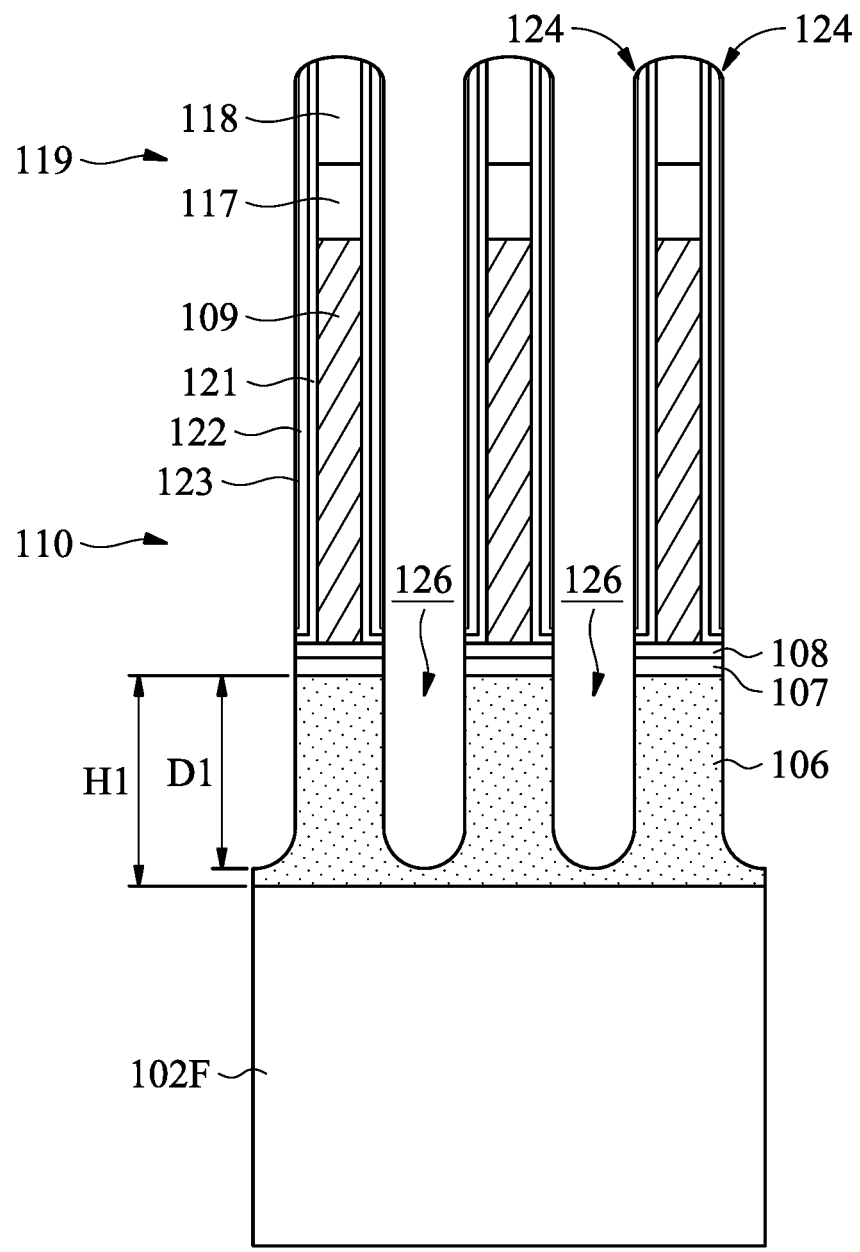

FIGS. 5A, 5B, 5C and 5D illustrate cross-sectional views of an intermediate structure at one stage of fabricating a semiconductor device following FIGS. 4A-4D, which are taken along line A-A, line B-B, line C-C and line D-D in FIG. 1, respectively, in accordance with some embodiments. Referring to FIG. 5B, the gate spacer material layer 120 is etched using an anisotropic etching process to form gate spacers 124 on the sidewalls of the dummy gate electrode layer 109, the first hard mask 117 and the second hard mask 118, in accordance with some embodiments. Afterwards, the disposable mandrel fin 106 is etched in an anisotropic etching process by using the gate spacers 124 and the dummy gate electrode layer 109 as an etching mask to form recesses 126 in the disposable mandrel fin 106 and on opposite sides of the dummy gate electrode layer 109. The anisotropic etching process may be selective with respect to one or more crystalline planes of the material of the disposable mandrel fin 106. Hence, the recesses 126 may have various cross-sectional profiles based on the etching process implemented. The dummy gate dielectric layer 108 and the hard mask 107 on the disposable mandrel fin 106 are also etched in the anisotropic etching process. The anisotropic etching process may be a dry etching process that includes RIE, NBE, or another etching process. The recesses 126 are located at the source and drain regions 112 of FIG. 1. In addition, the recesses 126 have a depth D1 below the hard mask 107. The depth D1 of the recesses 126 is smaller than the height H1 of the disposable mandrel fin 106.

Figure 5C:
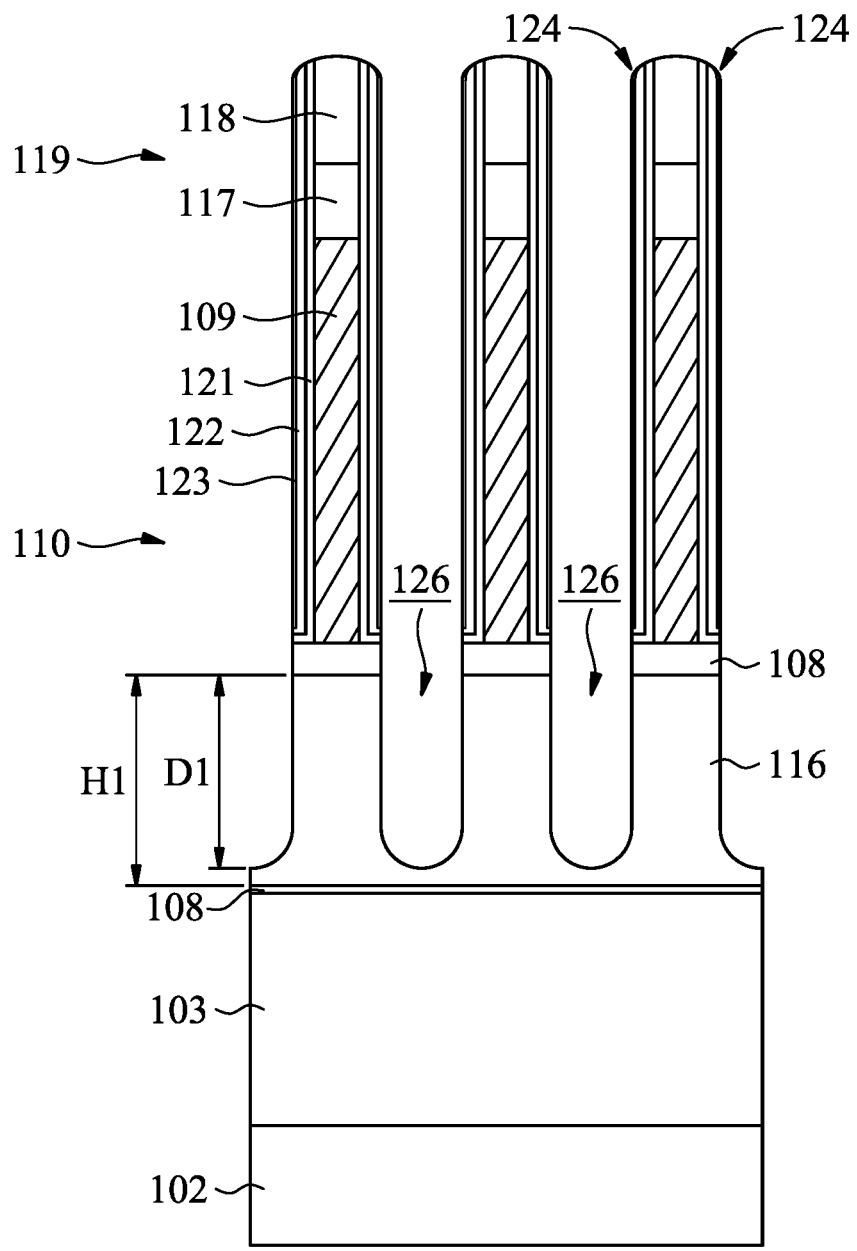

Referring to FIG. 5C, the channel fins 116 are also etched by using the gate spacers 124 and the dummy gate electrode layer 109 as an etching mask to form recesses 126 in the channel fins 116 and on opposite sides of the dummy gate electrode layer 109, in accordance with some embodiments. Moreover, the dummy gate dielectric layer 108 on the channel fins 116 is also etched in the etching process. The depth D1 of the recesses 126 is smaller than the height H1 of the channel fins 116.

After the gate spacer material layer 120 is etched to form the gate spacers 124, portions 124' of the gate spacer material layer 120 and the dummy gate dielectric layer 108 at the source and drain regions 112 (FIG. 1) may remain on the sidewalls of the channel fins 116, as shown in FIG. 5A in accordance with some embodiments. The portions of the gate spacer material layer 120 and the dummy gate dielectric layer 108 on the hard mask 107 and on the isolation structure 104 are also removed in the etching process of forming the gate spacers 124. Afterwards, the disposable mandrel fin 106 and the channel fins 116 between the portions 124' and at the source and drain regions 112 (FIG. 1) are etched to form the recess 126. In some examples, the portion 124' has a height H2 that is in a range from about 0 nm to about 30 nm. There are remaining portions of the disposable mandrel fin 106 and the channel fins 116 under the recess 126, between the portions 124' and on the fin 102F.

Figure 5D:
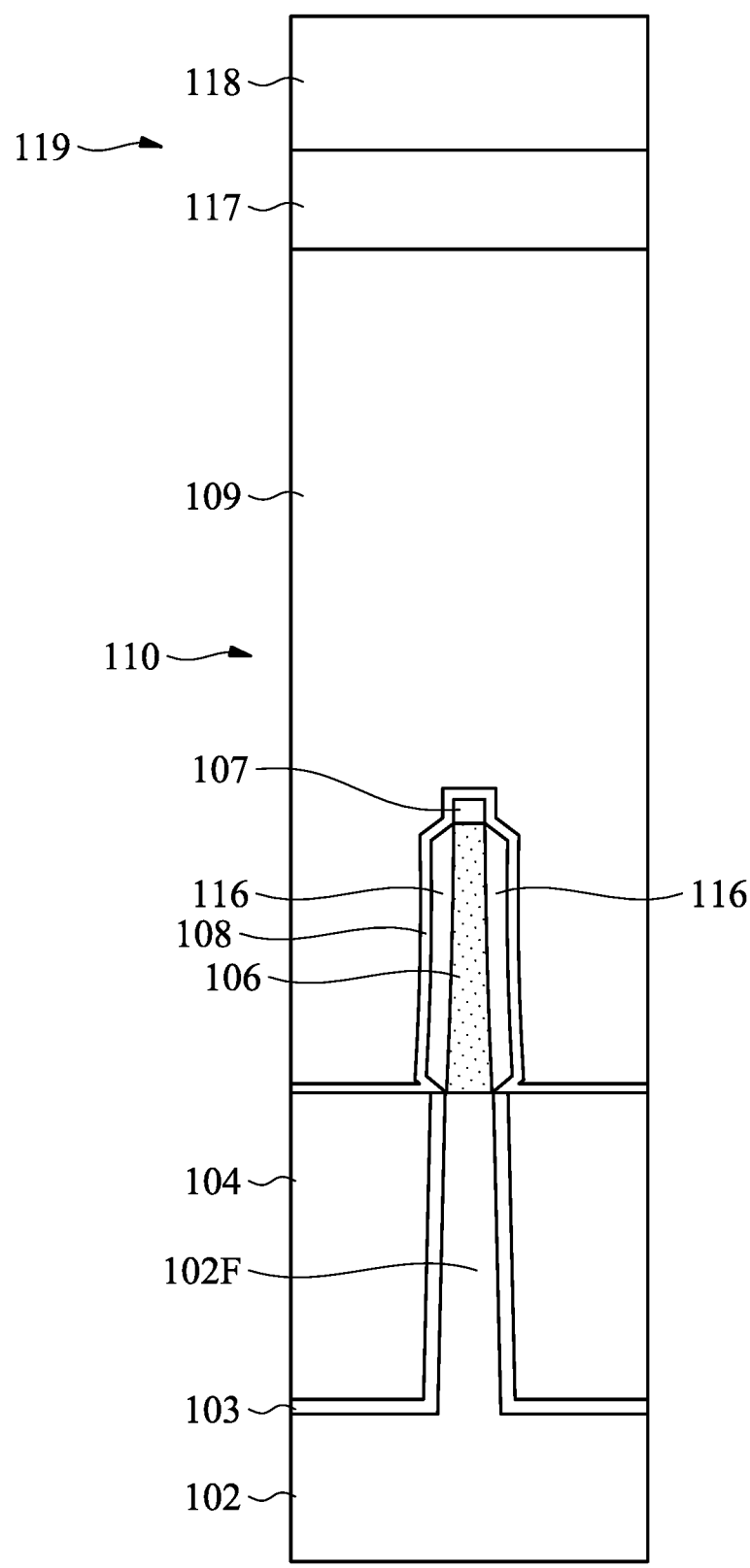

Referring to FIG. 5D, the gate spacer material layer 120 on the second hard mask 118 is removed at this stage of forming the gate spacers 124 and the recesses 126, in accordance with some embodiments. The other features of FIG. 5D are the same as those described with respect to FIG. 4D.

Figure 6A:
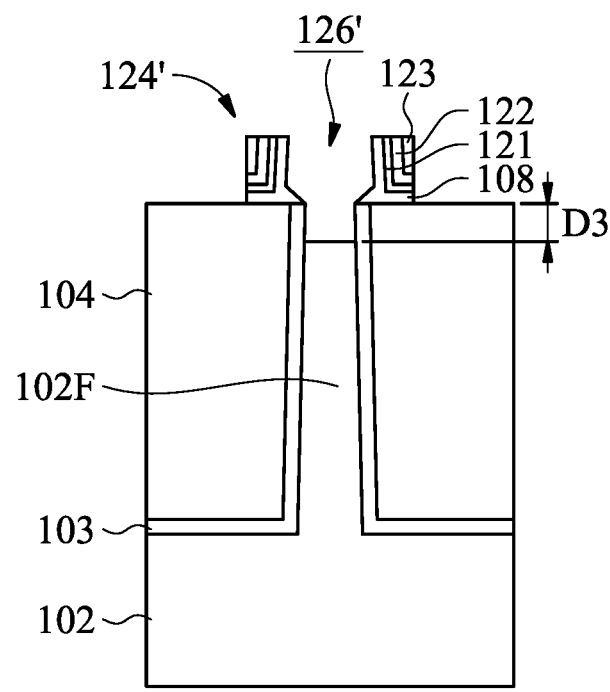
Figure 6B:
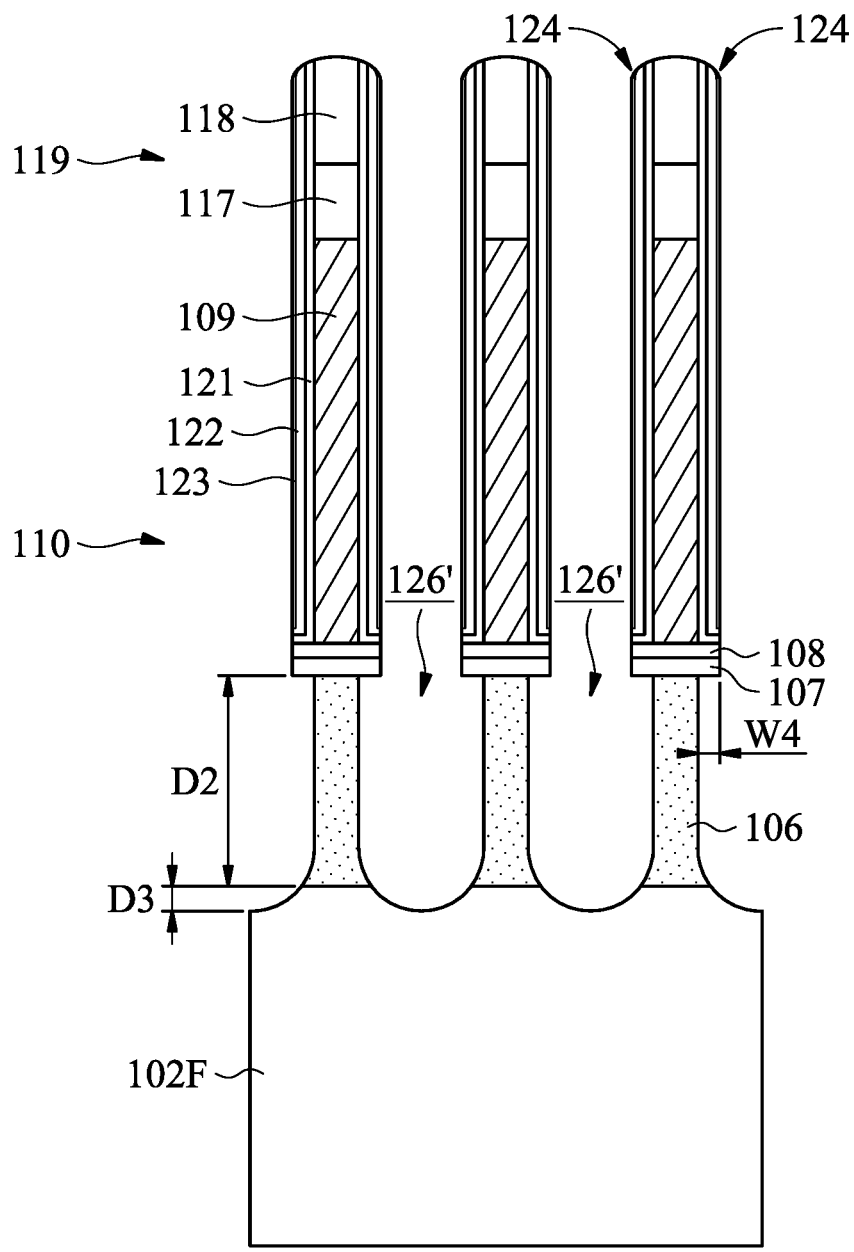

FIGS. 6A, 6B, 6C and 6D illustrate cross-sectional views of an intermediate structure at one stage of fabricating a semiconductor device following FIGS. 5A-5D, which are taken along line A-A, line B-B, line C-C and line D-D in FIG. 1, respectively, in accordance with some embodiments. Referring to FIG. 6B, the disposable mandrel fin 106 is further etched using an isotropic etching process to enlarge the recesses 126 of FIG. 5B to be recesses 126' in accordance with some embodiments. The isotropic etching process may be selective with respect to one or more crystalline planes of the material of the disposable mandrel fin 106. Hence, the recesses 126' may also have various cross-sectional profiles based on the etching process implemented. The isotropic etching process includes a dry etching process, a wet etching process or a combination thereof. The dry etching process may be RIE, NBE, or another dry etching process. The wet etching process may be performed using tetramethylammonium hydroxide (TMAH), ammonium hydroxide (NH₄OH), or another etchant.

In some embodiments, the disposable mandrel fin 106 of FIG. 5B is recessed using a plasma etching process to remove the sidewall portions of the disposable mandrel fin 106 directly under the gate spacers 124. In some examples, the disposable mandrel fin 106 is recessed from the sidewall of the hard mask 107 with a distance W4. In some examples, the distance W4 is in a range from about 3 nm to about 8 nm. Moreover, portions of the disposable mandrel fin 106 and the fin 102F under the recesses 126 of FIG. 5B may be removed. The recesses 126' have a depth D2 under the hard mask 107 and in the disposable mandrel fin 106. The depth D2 may be the same as the height H1 of the disposable mandrel fin 106 (FIG. 3A-1). The depth D2 of the recesses 126' is larger than the depth D1 of the recesses 126 (FIG. 5B). The upper portion of the fin 102F may be removed by a depth D3 in the etching process forming the recesses 126'. In some examples, the depth D3 is in a range from about 3 nm to about 8 nm.

Figure 6C:
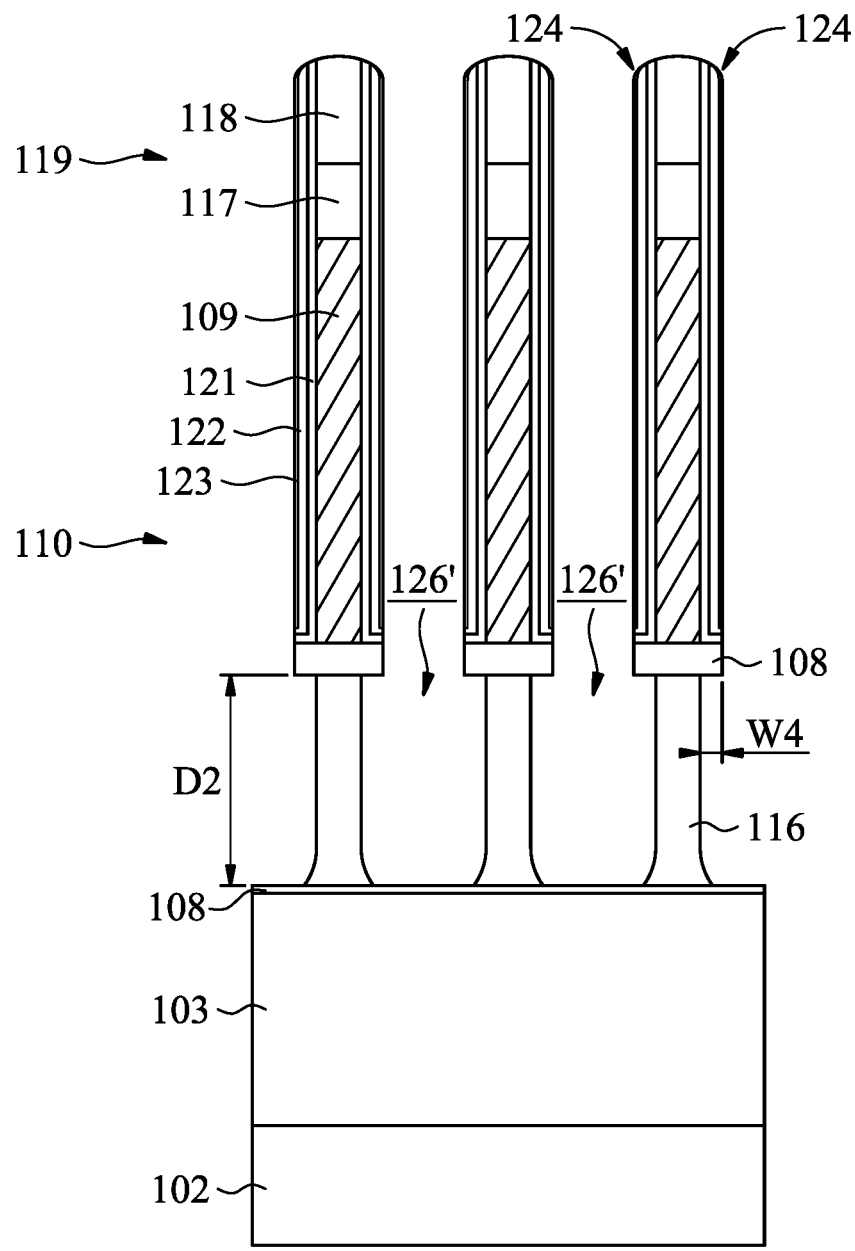

Referring to FIG. 6C, the channel fin 116 is also recessed using the isotropic etching process described in FIG. 6B to enlarge the recesses 126 of FIG. 5C to form recesses 126' in accordance with some embodiments. The channel fin 116 of FIG. 5C is recessed in the isotropic etching process to remove the sidewall portions of the channel fin 116 directly under the gate spacers 124. In some examples, the channel fin 116 is recessed with a distance W4 that is in a range from about 3 nm to about 8 nm. Moreover, portions of the channel fin 116 under the recesses 126 of FIG. 5C may be removed in the isotropic etching process for forming the recesses 126'. The recesses 126' have the depth D2 under the dummy gate dielectric layer 108 and in the channel fin 116. The depth D2 of the recesses 126' is larger than the depth D1 of the recesses 126 (shown in FIG. 5C). The depth D2 of the recesses 126' is the same as the height H1 of the channel fins 116 (FIG. 3A-1). In some other embodiments, the channel fin 116 is not recessed while the disposable mandrel fin 106 is recessed.

Referring to FIG. 6A, the remaining portions of the disposable mandrel fin 106 and the channel fins 116 under the recess 126 shown in FIG. 5A are removed in accordance with some embodiments. Moreover, the upper portion of the fin 102F is removed by the depth D3 to form the recess 126'. In some examples, the depth D3 is in a range from about 3 nm to about 8 nm.

Figure 6D:
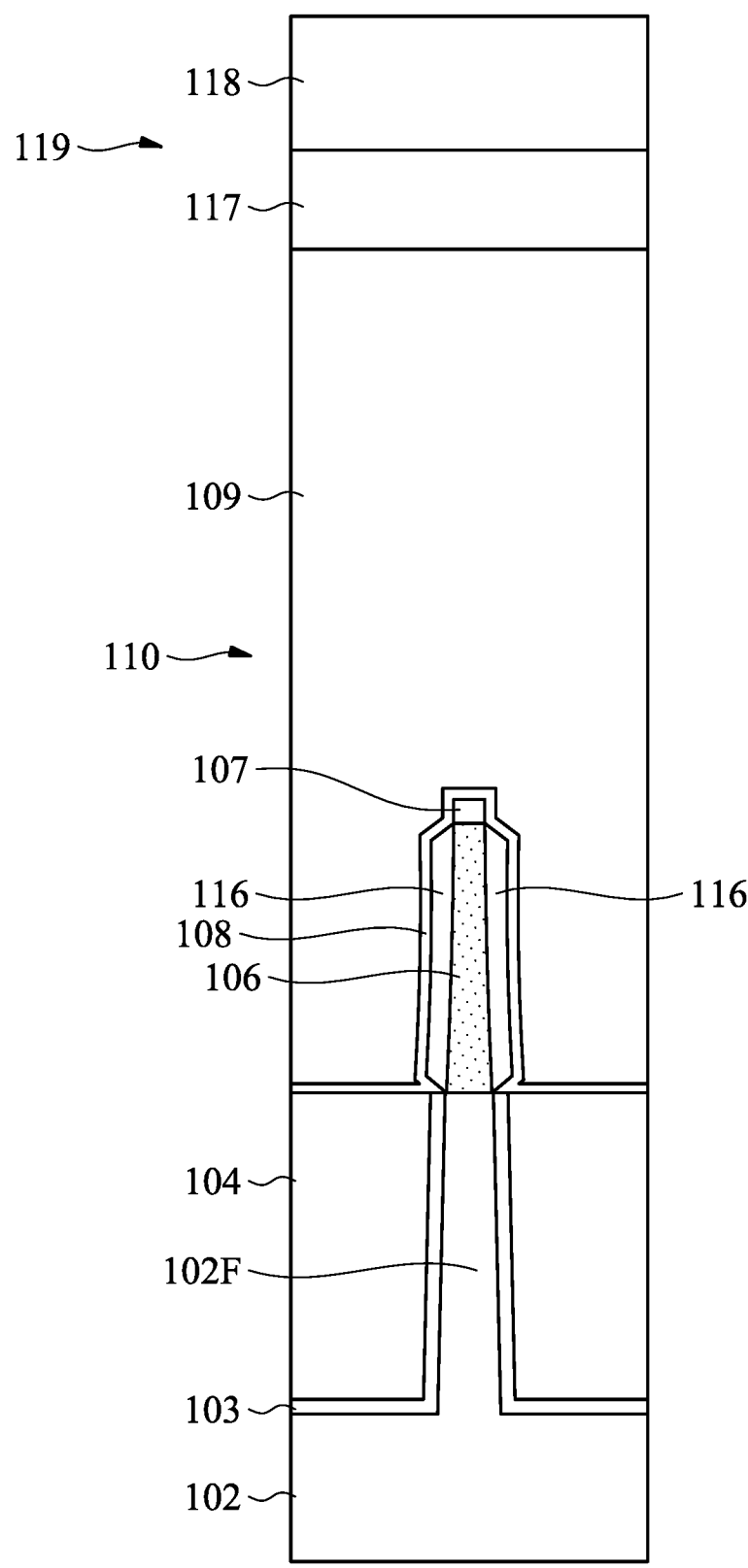

Referring to FIG. 6D, a cross-sectional view of the intermediate structure taken along line D-D in FIG. 1 at this stage of forming the recesses 126' is the same as the intermediate structure of FIG. 5D, in accordance with some embodiments.

Figure 7A:
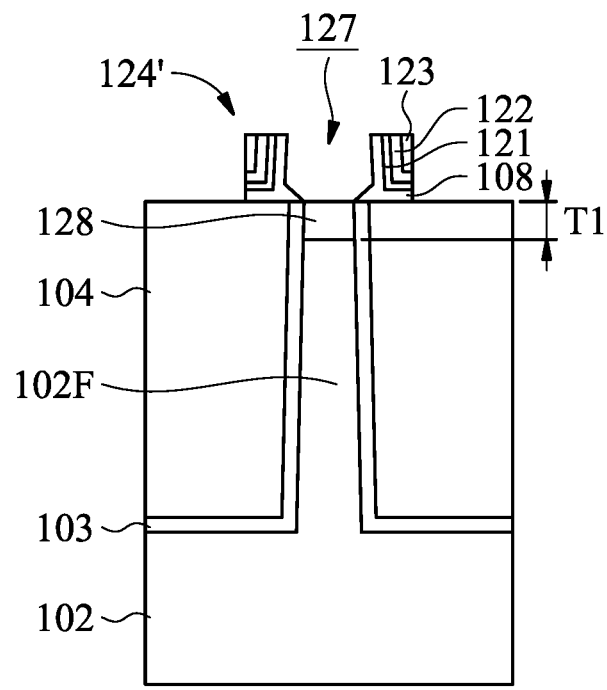
Figure 7B:
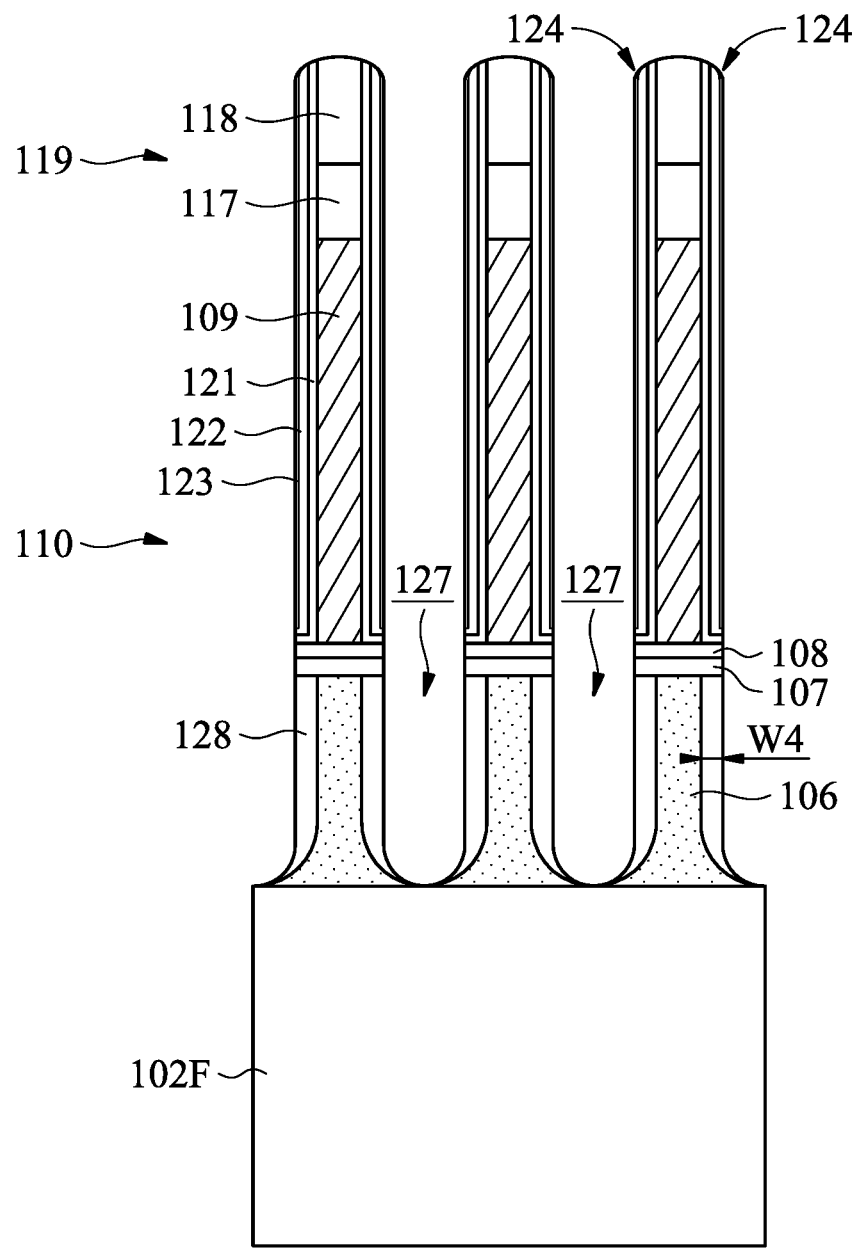

FIGS. 7A, 7B, 7C and 7D illustrate cross-sectional views of an intermediate structure at one stage of fabricating a semiconductor device following FIGS. 6A-6D, which are taken along line A-A, line B-B, line C-C and line D-D in FIG. 1, respectively, in accordance with some embodiments. Referring to FIG. 7B, channel recovered features 128 are formed on the sidewalls of the recessed disposable mandrel fin 106, in accordance with some embodiments. The channel recovered features 128 are formed along the sidewalls of the recesses 126' of FIG. 6B. The channel recovered features 128 are made of a semiconductor material that is the same as the semiconductor material of the channel fins 116 and different from the semiconductor material of the disposable mandrel fin 106. In some embodiments, the channel recovered features 128 are made of Si, and the disposable mandrel fin 106 is made of SiGe. The channel recovered features 128 may be formed using an epitaxial growth process. The channel recovered features 128 are formed directly under the gate spacers 124 and have a width W4. In some examples, the width W4 of the channel recovered features 128 is in a range from about 3 nm to about 8 nm. After the channel recovered features 128 are formed, there are recesses 127 between the channel recovered features 128. In some other embodiments, the channel fin 116 is not recessed and the disposable mandrel fin 106 is recessed. The channel recovered features 128 are omitted and inner spacers are formed at the position of the channel recovered features 128. The inner spacers are formed by refilling the recessed disposable mandrel fin 106 with a dielectric material and etching back the dielectric material to align with the hard mask 107 and the gate spacers 124. The inner spacers on the sidewalls of the recessed disposable mandrel fin 106 can improve the performance of the semiconductor device.

Figure 7C:
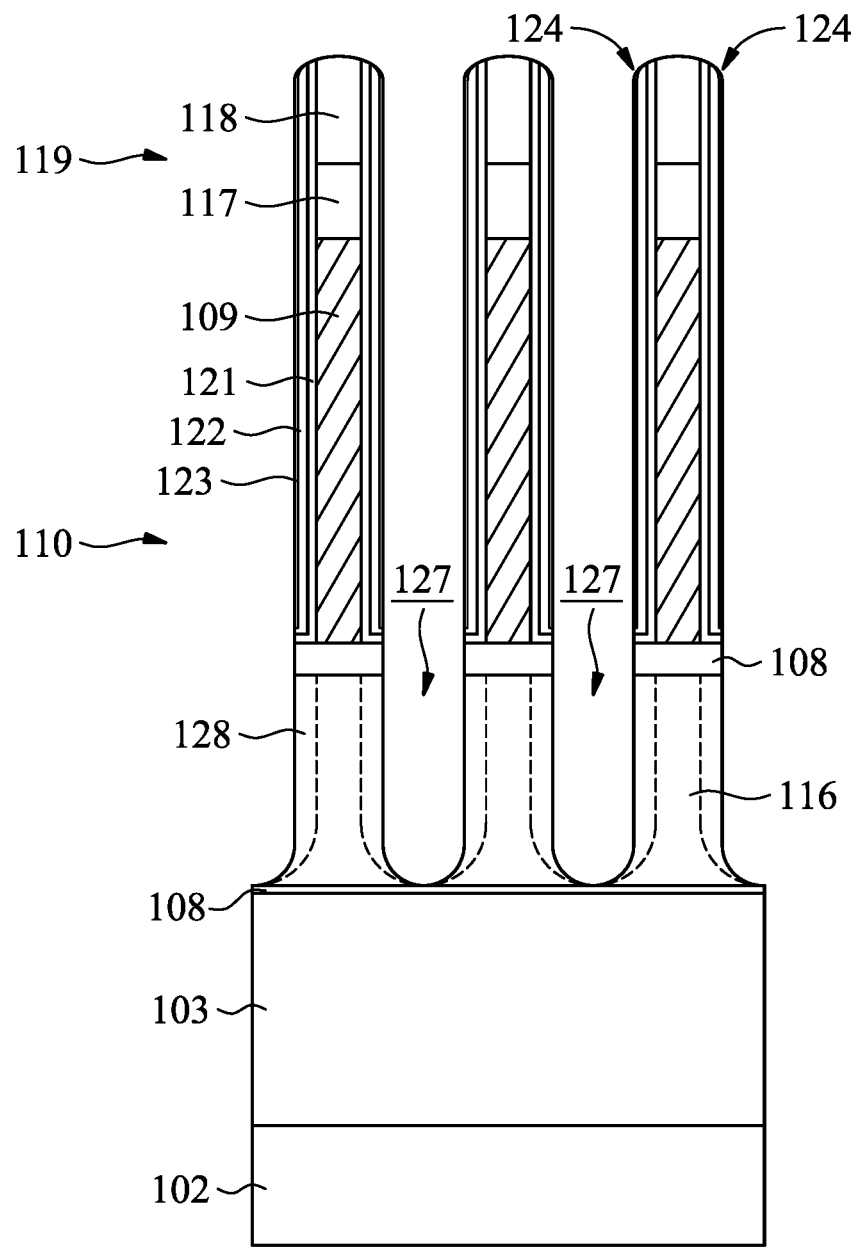

Referring to FIG. 7C, the channel recovered features 128 are also formed on the sidewalls of the channel fins 116 and directly under the gate spacers 124, in accordance with some embodiments. The channel recovered features 128 and the channel fins 116 are made of the same material. There is no boundary (shown by a dashed line in FIG. 7C) between the channel recovered features 128 and the channel fins 116. Thereafter, the channel recovered features 128 on the sidewalls of the channel fins 116 are omitted in the following illustrations. Also, the recesses 127 are formed in the channel fins 116 between the channel recovered features 128.

Referring to FIG. 7A, the channel recovered feature 128 is formed to fill the recess on the fin 102F and lower the top surface of the isolation structure 104, in accordance with some embodiments. The channel recovered features 128 and the fin 102F are made of the same material. There is no boundary (shown by a dashed line in FIG. 7A) between the channel recovered features 128 and the fin 102F. Thereafter, the channel recovered features 128 on the fin 102F may be omitted in the following illustrations. In some examples, the channel recovered feature 128 on the fin 102F has a thickness T1 that is in a range from about 3 nm to about 8 nm. The recess 127 is formed on the channel recovered feature 128 and between the remaining portions 124' of the gate spacers 124.

Figure 7D:
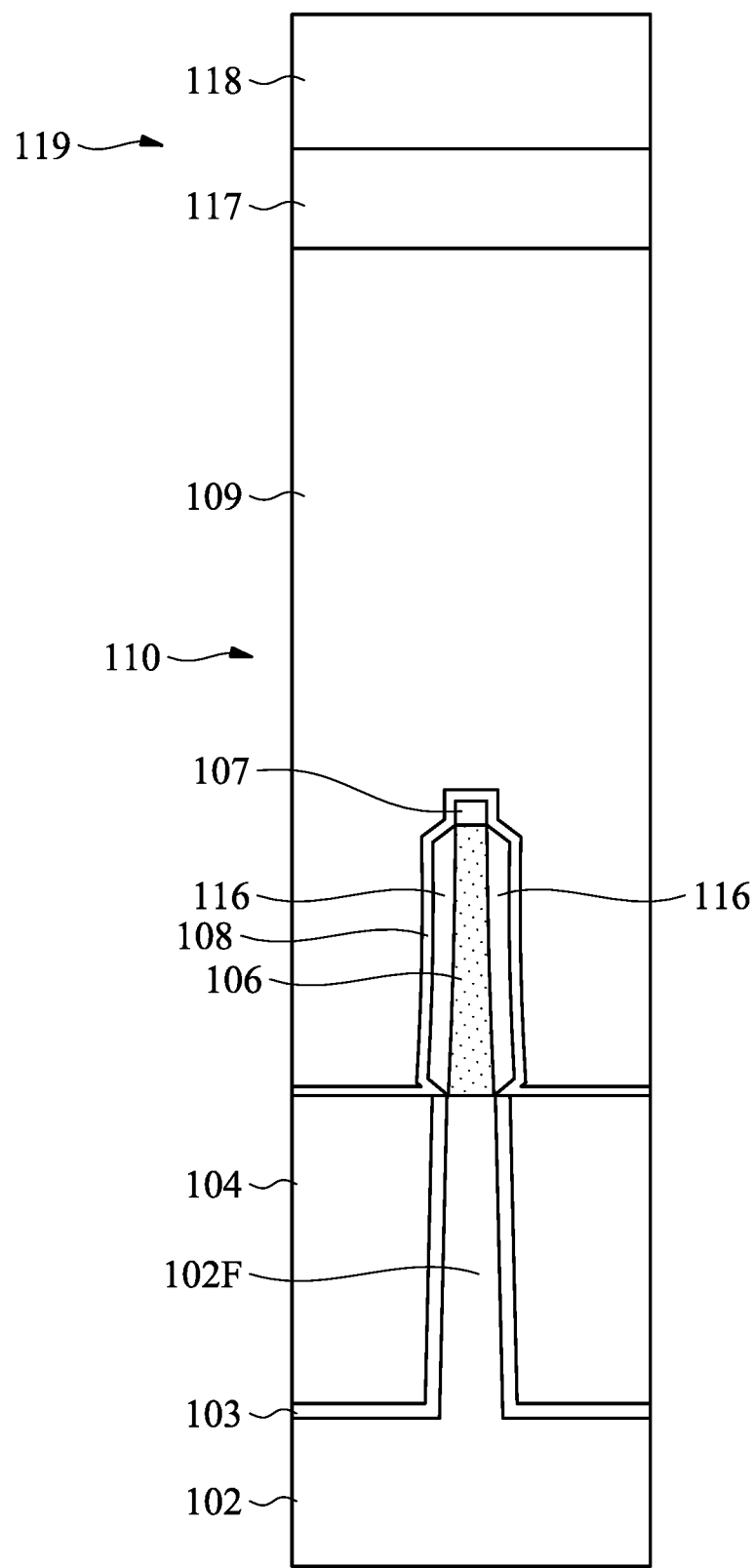

Referring to FIG. 7D, a cross-sectional view of the intermediate structure taken along line D-D in FIG. 1 at this stage of forming the channel recovered feature 128 and the recesses 127 is also the same as the intermediate structure of FIG. 5D, in accordance with some embodiments.

Figure 8A:
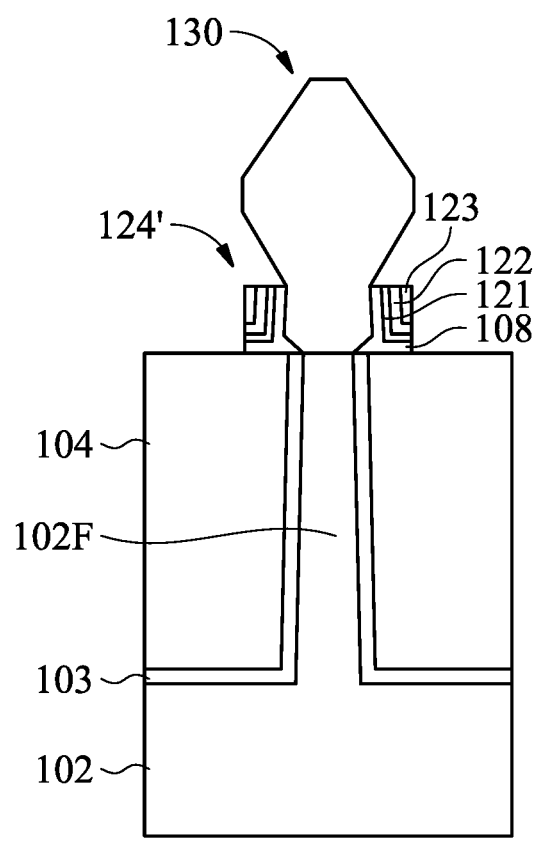
Figure 8B:
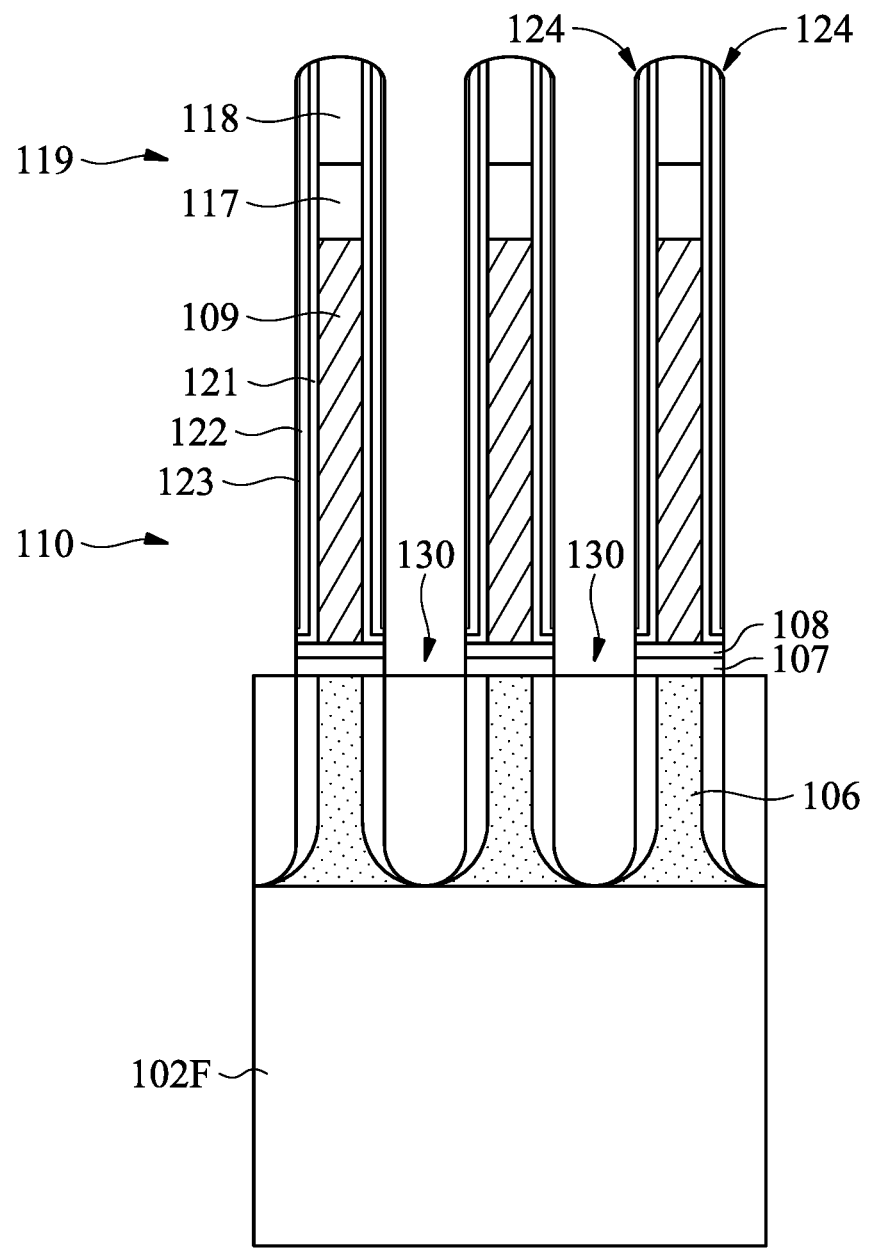

FIGS. 8A, 8B, 8C and 8D illustrate cross-sectional views of an intermediate structure at one stage of fabricating a semiconductor device following FIGS. 7A-7D, which are taken along line A-A, line B-B, line C-C and line D-D in FIG. 1, respectively, in accordance with some embodiments. Referring to FIG. 8B, epitaxial source and drain structures 130 are formed in the recesses 127 of FIG. 7B, in accordance with some embodiments. The epitaxial source and drain structures 130 are epitaxially grown on continuous surfaces of the channel recovered features 128 without inner sidewall spacers between the channel recovered features 128 and the epitaxial source and drain structures 130. The epitaxial source and drain structures 130 are on opposite sides of the dummy gate structure 110 that includes the dummy gate dielectric layer 108 and the dummy gate electrode layer 109. In some instances, the top surfaces of the epitaxial source and drain structures 130 may be higher than or coplanar with the top surface of the disposable mandrel fin 106. The channel recovered features 128 disposed directly under the gate spacers 124 can be used as lightly doped source and drain (LDD) regions. In some other embodiments, the disposable mandrel fin 106 is recessed. The above mentioned inner spacers are formed on the sidewalls of the recessed disposable mandrel fin 106 and are disposed between the channel fins 116. The inner spacers can improve the performance of the semiconductor device.

The epitaxial source and drain structures 130 may include silicon germanium ($Si_xGe_{1-x}$, where x can be between approximately 0 and 1), silicon carbide, silicon phosphorus, germanium, an III-V compound semiconductor, an II-VI compound semiconductor, or another epitaxial semiconductor. For example, the materials of an III-V compound semiconductor may include InAs, AlAs, GaAs, InP, GaN, InGaAs, InAlAs, GaSb, AlSb, AlP or GaP. The epitaxial source and drain structures 130 may be formed by metal-organic CVD (MOCVD), molecular beam epitaxy (MBE), liquid phase epitaxy (LPE), vapor phase epitaxy (VPE), selective epitaxial growth (SEG), or a combination thereof. Each of the epitaxial source and drain structures 130 has several facets (not shown). The epitaxial source and drain structures 130 may be doped by in-situ doping during the epitaxial growth and/or by implantation after the epitaxial growth. Hence, the source and drain regions 112 of FIG. 1 may be formed by epitaxial growth, and possibly with implantation, on opposite sides of the dummy gate structures 110.

Figure 8C:
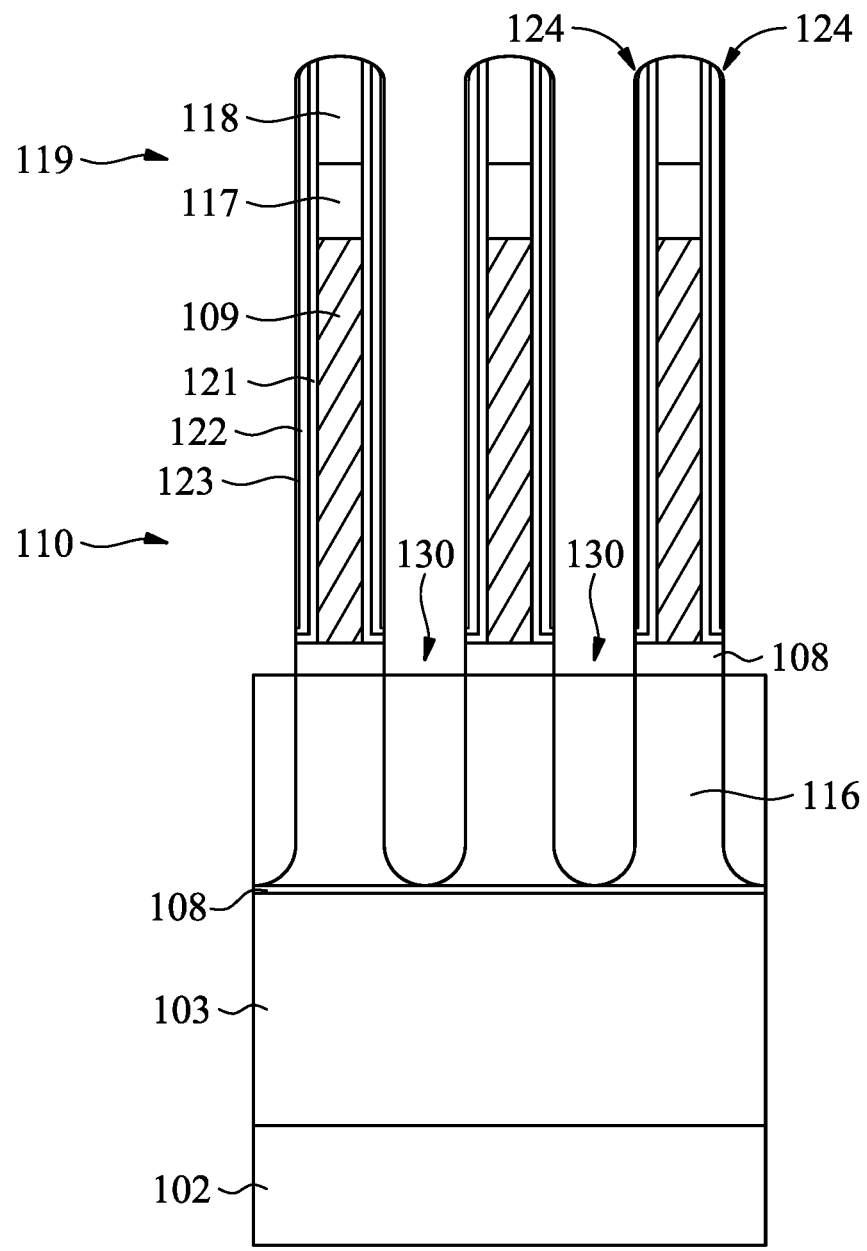

Referring to FIG. 8C, the epitaxial source and drain structures 130 are also formed in the recesses 127 of the channel fin 116 (shown in FIG. 7C), in accordance with some embodiments. The epitaxial source and drain structures 130 are disposed on opposite sides of the dummy gate structure 110. In some instances, the top surfaces of the epitaxial source and drain structures 130 may be higher than or coplanar with the top surface of the channel fin 116.

Referring to FIG. 8A, the epitaxial source and drain structure 130 is formed in the recess 127 of FIG. 7A and over the fin 102F, in accordance with some embodiments. The epitaxial source and drain structure 130 has several facets as shown in FIG. 8A in accordance with some embodiments. The top surface of the epitaxial source and drain structure 130 is higher than that of the remaining portions 124' of the gate spacers 124. In some examples, the epitaxial source and drain structure 130 has multiple regions that may have different compositions in the epitaxial materials from each other.

Figure 8D:
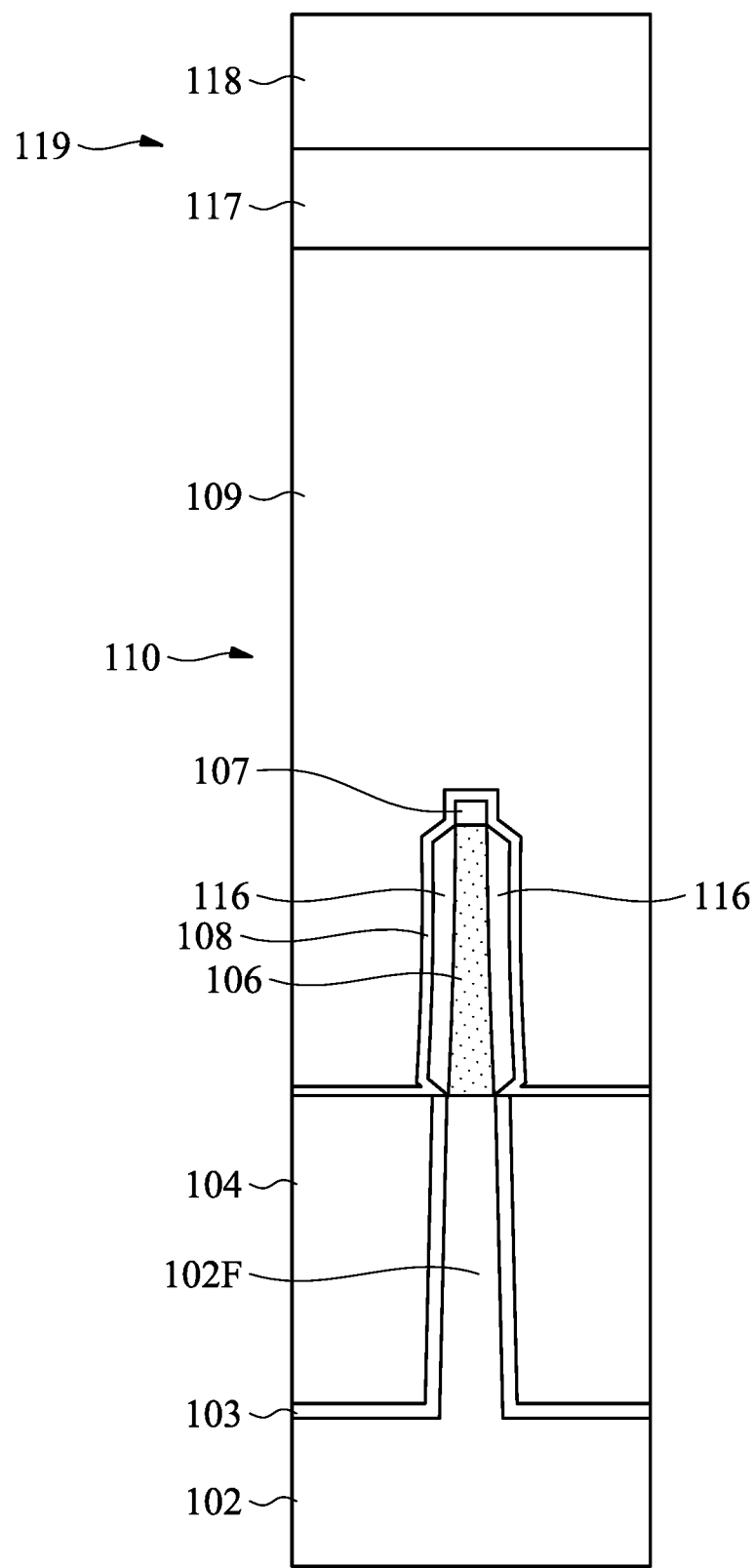

Referring to FIG. 8D, a cross-sectional view of the intermediate structure taken along line D-D in FIG. 1 at this stage of forming the epitaxial source and drain structures 130 is also the same as the intermediate structure of FIG. 5D, in accordance with some embodiments.

Figure 9A:
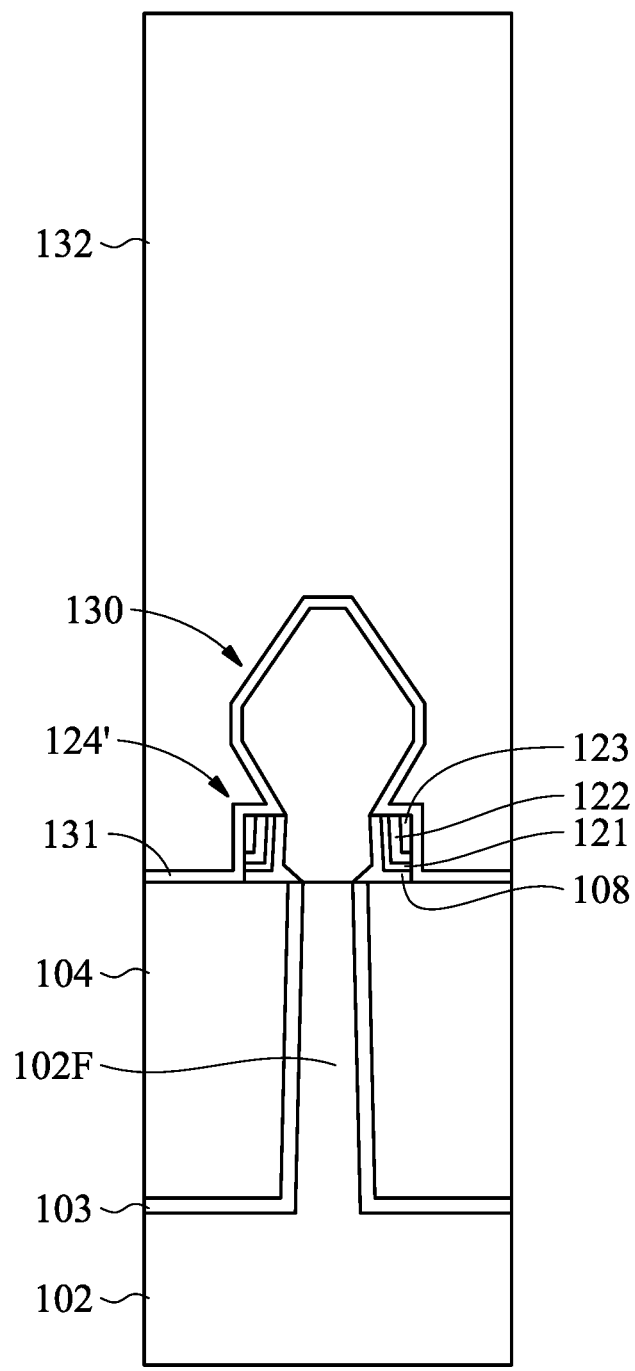
Figure 9B:
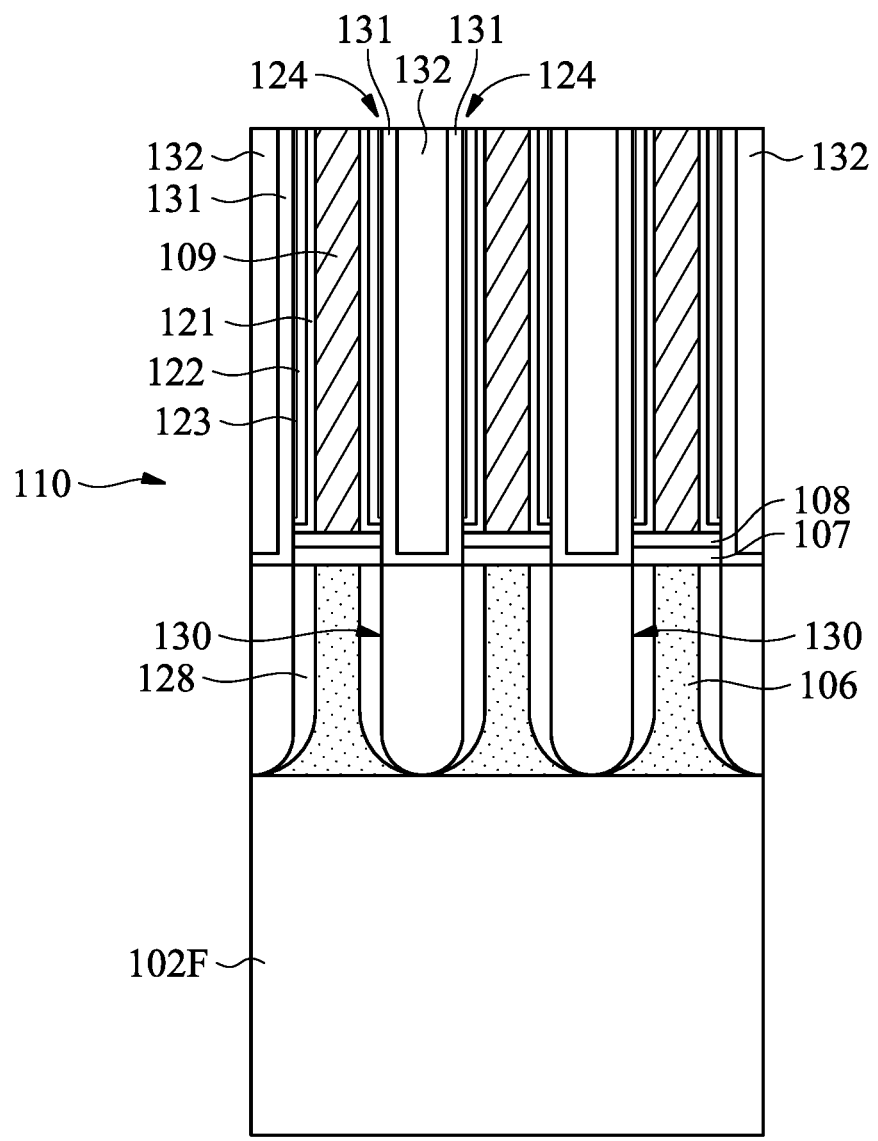

FIGS. 9A, 9B, 9C and 9D illustrate cross-sectional views of an intermediate structure at one stage of fabricating a semiconductor device following FIGS. 8A-8D, which are taken along line A-A, line B-B, line C-C and line D-D in FIG. 1, respectively, in accordance with some embodiments. Referring to FIG. 9B, a contact etch stop layer (CESL) 131 and an interlayer dielectric (ILD) layer 132 are formed over the epitaxial source and drain structures 130, in accordance with some embodiments. The CESL 131 and the ILD layer 132 are deposited to fill the spaces between the dummy gate structures 110 and between the gate spacers 124. The CESL 131 and the ILD layer 132 are also deposited on the hard mask structure 119 over the dummy gate structure 110 (FIG. 8B). The CESL 131 is conformally deposited along the sidewalls of the gate spacers 124 and on the top surfaces of the epitaxial source and drain structures 130. The ILD layer 132 is deposited on the CESL 131 and around the gate spacers 124.

Generally, the CESL 131 can provide a mechanism to stop an etching process when forming via contacts to the epitaxial source and drain structures 130. The CESL 131 may be formed of a dielectric material having a different etch selectivity from the adjacent ILD layer 132. The material of the CESL 131 may include silicon nitride (SiN or $Si_3N_4$), silicon carbon nitride (SiCN) or a combination thereof, and may be deposited by CVD, PECVD, ALD, or another deposition process. In some examples, the CESL 131 has a thickness in a range from about 2 nm to about 5 nm. The material of the ILD layer 132 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 132 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 132 and the CESL 131. The first hard mask 117 and the second hard mask 118 over the dummy gate structure 110 (FIG. 8B) are removed in the planarization process. In addition, a portion of the ILD layer 132 and a portion of the CESL 131 on the sidewalls of the first hard mask 117 and the second hard mask 118 are also removed in the planarization process until stop at the top surface of the dummy gate electrode layer 109. After the planarization process, the dummy gate electrode layer 109 and the gate spacers 124 are exposed. The top surfaces of the ILD layer 132 and the CESL 131 are coplanar with the top surfaces of the dummy gate electrode layer 109 and the gate spacers 124.

Figure 9C:
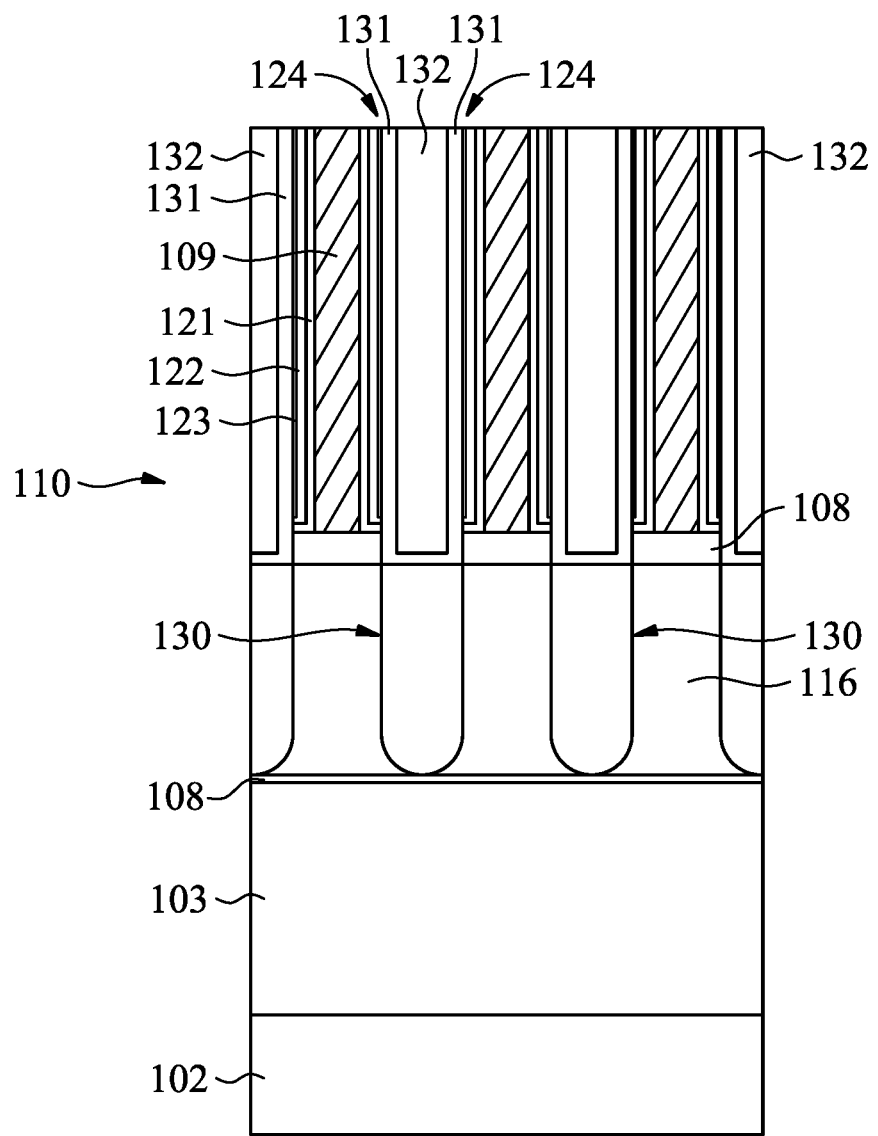

Referring to FIG. 9C, the CESL 131 and the ILD layer 132 are also formed on the epitaxial source and drain structures 130 that are disposed in the channel fin 116, in accordance with some embodiments. The planarization process of FIG. 9B is also performed on the CESL 131 and the ILD layer 132 of FIG. 9C. After the planarization process, the dummy gate electrode layer 109 and the gate spacers 124 are exposed. The top surfaces of the ILD layer 132 and the CESL 131 are coplanar with the top surfaces of the dummy gate electrode layer 109 and the gate spacers 124.

Referring to FIG. 9A, the CESL 131 and the ILD layer 132 are formed on the epitaxial source and drain structure 130 and on the isolation structure 104, in accordance with some embodiments. The CESL 131 is conformally deposited on the top surface and the facets of the epitaxial source and drain structure 130, along the sidewalls of the remaining portions 124' of the gate spacers 124, and on the top surface of the isolation structure 104.

Figure 9D:
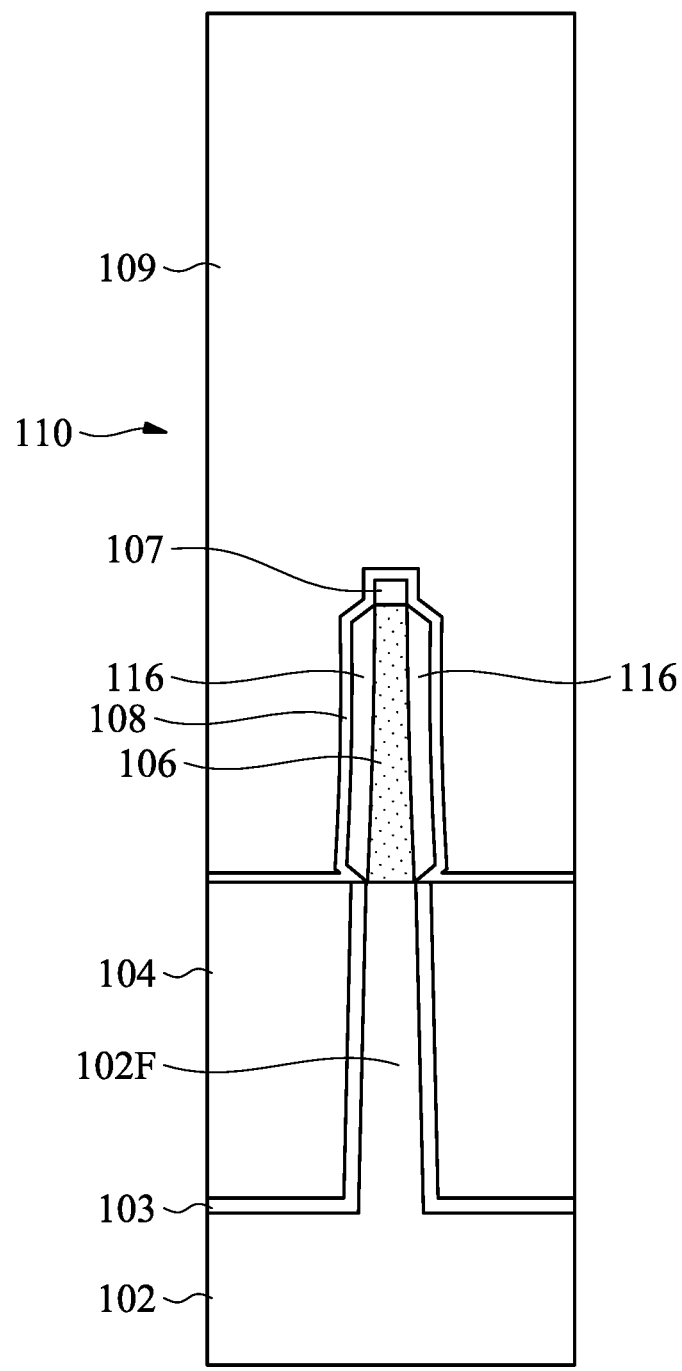

Referring to FIG. 9D, the first hard mask 117 and the second hard mask 118 (FIG. 8B) over the dummy gate structure 110 are removed after the planarization process, in accordance with some embodiments. The other features of FIG. 9D are the same as those described with respect to FIG. 5D.

Figure 10A:
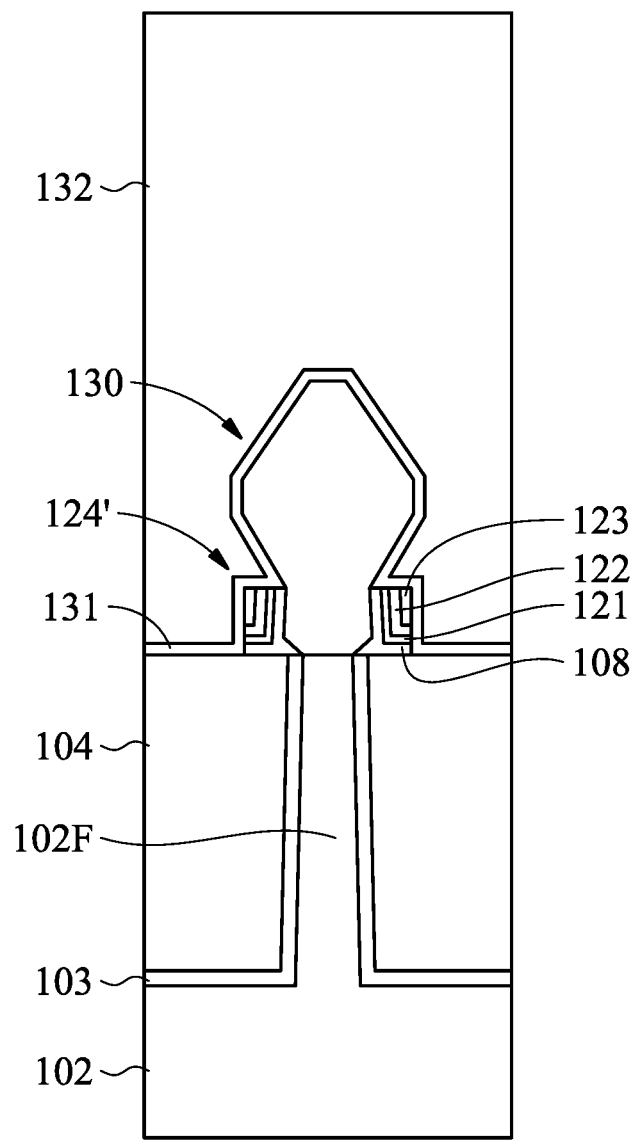
Figure 10B:
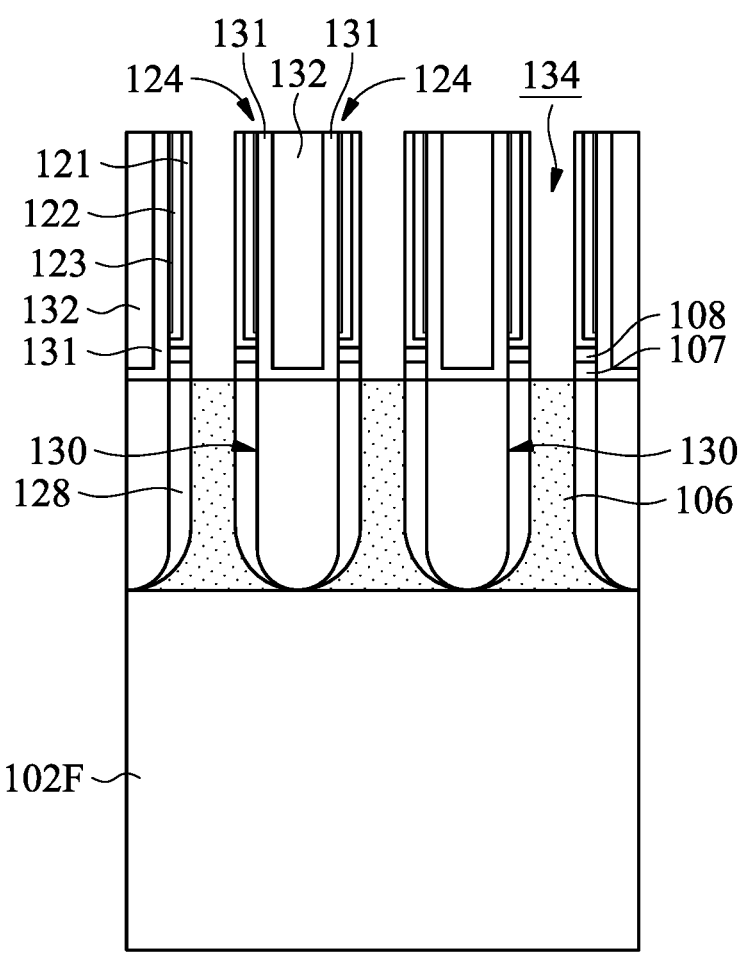

FIGS. 10A, 10B, 10C and 10D illustrate cross-sectional views of an intermediate structure at one stage of fabricating a semiconductor device following FIGS. 9A-9D, which are taken along line A-A, line B-B, line C-C and line D-D in FIG. 1, respectively, in accordance with some embodiments. Referring to FIG. 10B, the dummy gate structure 110 (FIG. 9B) and the hard mask 107 under the dummy gate structure 110 are removed in one or more etching processes to form trenches 134 between the gate spacers 124, in accordance with some embodiments. In the etching process, each of the materials of the dummy gate structure 110 and the hard mask 107 have a high etch selectivity while compared with the materials of the ILD layer 132, the CESL 131 and the gate spacers 124. The etching process may be a dry etching process, such as a remote plasma etching process that may use a gas mixture of HF-based gas, $N_2$ and $NH_3$ to generate radicals by remote plasma source (RPS). Alternatively, the etching process may be a wet etching process using a chemical etchant that has a high selectivity to the materials of the dummy gate structure 110 and the hard mask 107 while compared with the materials of the ILD layer 132, the CESL 131 and the gate spacers 124. The chemical etchant is for example hydrofluoric acid (HF). The portions of the dummy gate dielectric layer 108 and the hard mask 107 directly under the gate spacers 124 remain on the channel recovered feature 128. The disposable mandrel fin 106 is exposed through the trenches 134.

Figure 10C:
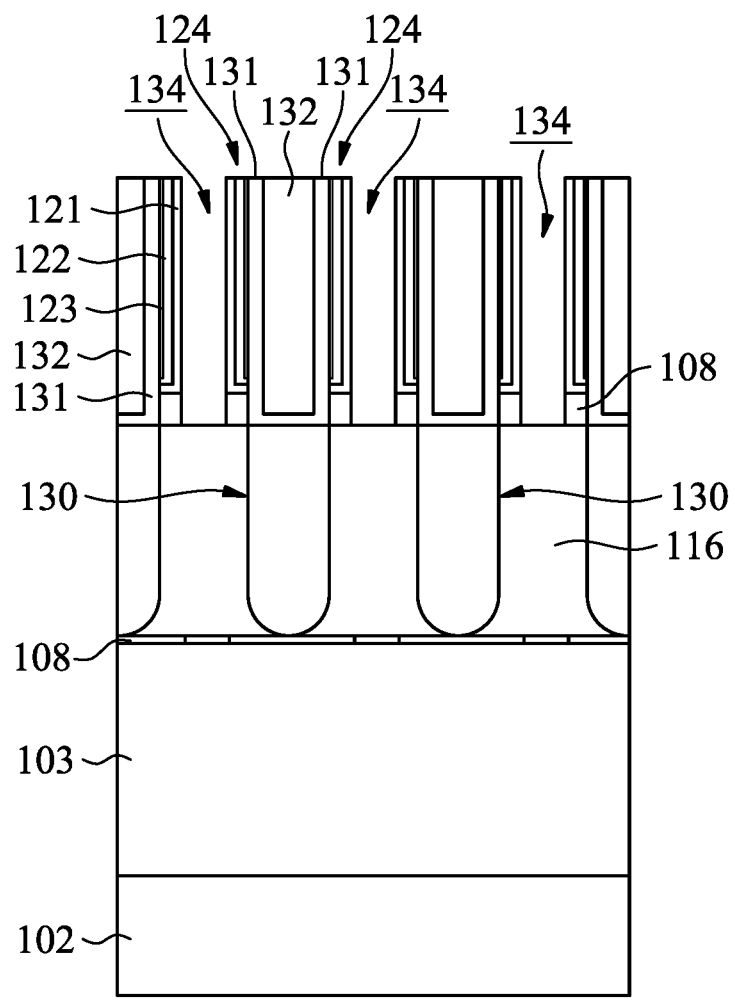

Referring to FIG. 10C, the dummy gate structure 110 (FIG. 9C) is removed in the etching process of FIG. 10B to form the trenches 134 between the gate spacers 124, in accordance with some embodiments. A portion of the dummy gate dielectric layer 108 directly under the gate spacers 124 remains on the channel recovered feature 128 (not shown) that along the sidewalls of the channel fin 116. Moreover, the channel fin 116 is exposed through the trenches 134.

Referring to FIG. 10A, a cross-sectional view of the intermediate structure taken along line A-A in FIG. 1 at this stage of forming the trenches 134 is the same as the intermediate structure of FIG. 9A, in accordance with some embodiments.

Figure 10D:
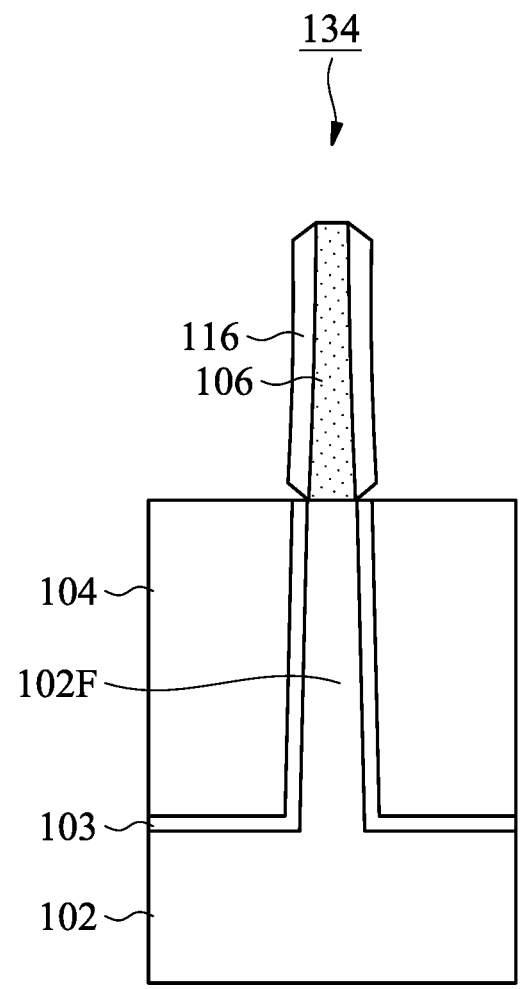

Referring to FIG. 10D, the dummy gate structure 110 (FIG. 9D) is removed in the etching process of FIG. 10B to form the trenches 134, in accordance with some embodiments. Also, the hard mask 107 on the disposable mandrel fin 106 is removed in the etching process of FIG. 10B. The disposable mandrel fin 106 and the channel fin 116 of the intermediate structure of FIG. 10D are exposed through the trenches 134.

Figure 11A:
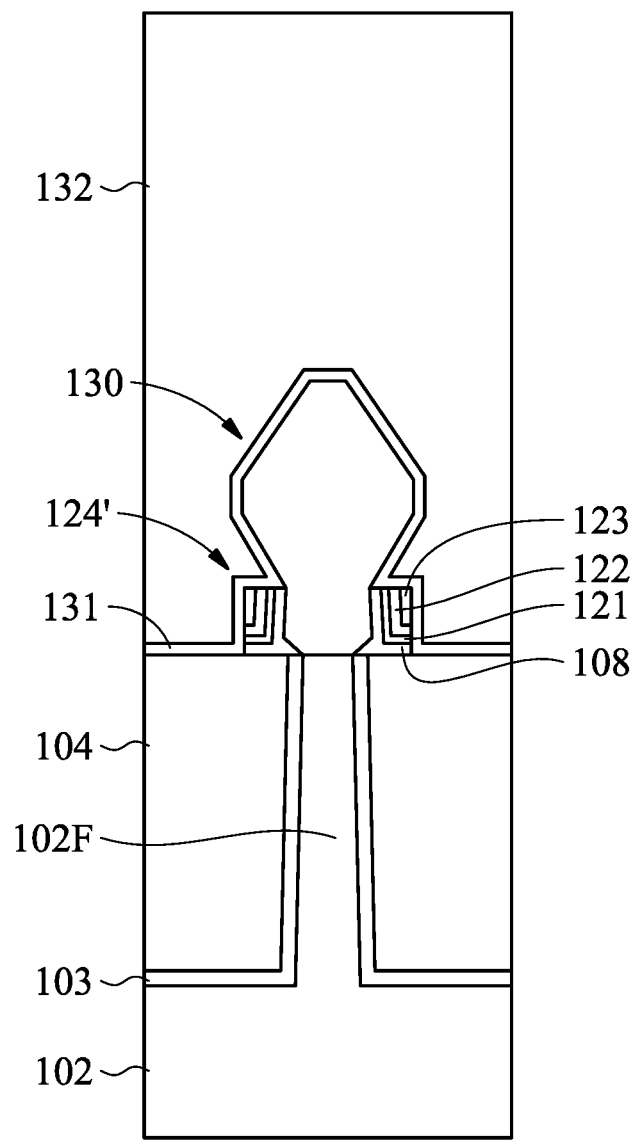
Figure 11B:
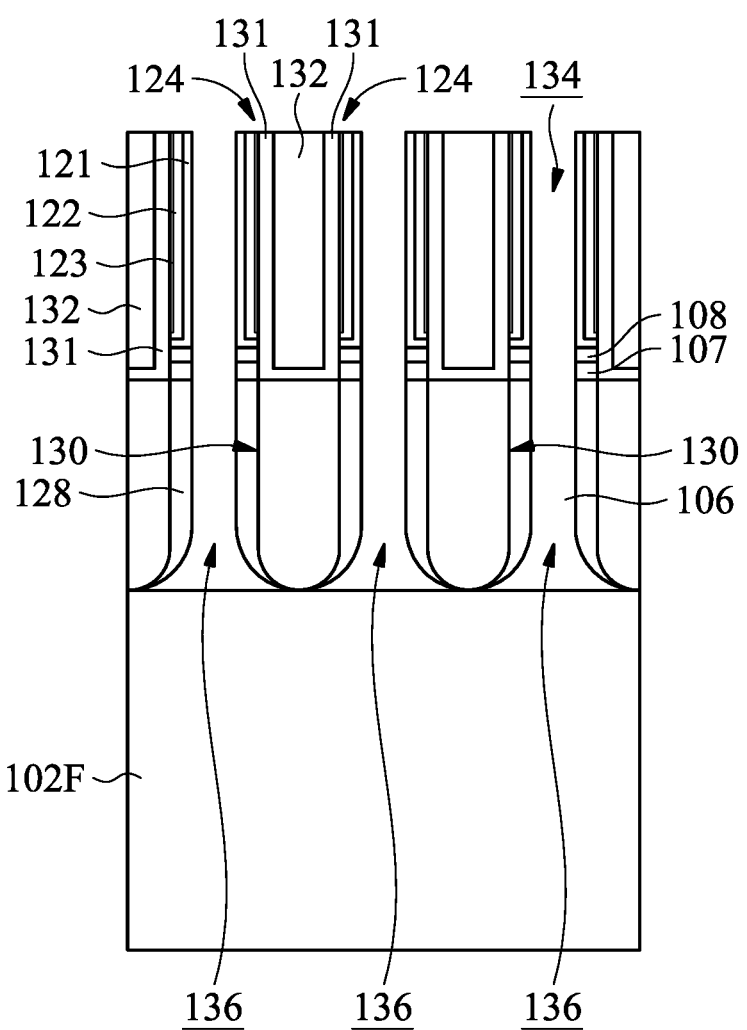

FIGS. 11A, 11B, 11C and 11D illustrate cross-sectional views of an intermediate structure at one stage of fabricating a semiconductor device following FIGS. 10A-10D, which are taken along line A-A, line B-B, line C-C and line D-D in FIG. 1, respectively, in accordance with some embodiments. Referring to FIG. 11B, the disposable mandrel fin 106 of FIG. 10B is removed in an etching process to form spaces 136, in accordance with some embodiments. Each of the spaces 136 is formed between the channel recovered features 128 and under the trenches 134. The channel recovered features 128 have an etch selectivity that is lower than the disposable mandrel fin 106. Therefore, the channel recovered features 128 can be used as an etch stop layer in the etching process for removing the disposable mandrel fin 106 in the intermediate structure of FIG. 11B. The etching process may be a dry etching process such as RIE process or a dry chemical etching process using etchant gas without plasma, or a wet etching process using a chemical etchant solution. The fin 102F is exposed through the spaces 136.

Figure 11C:
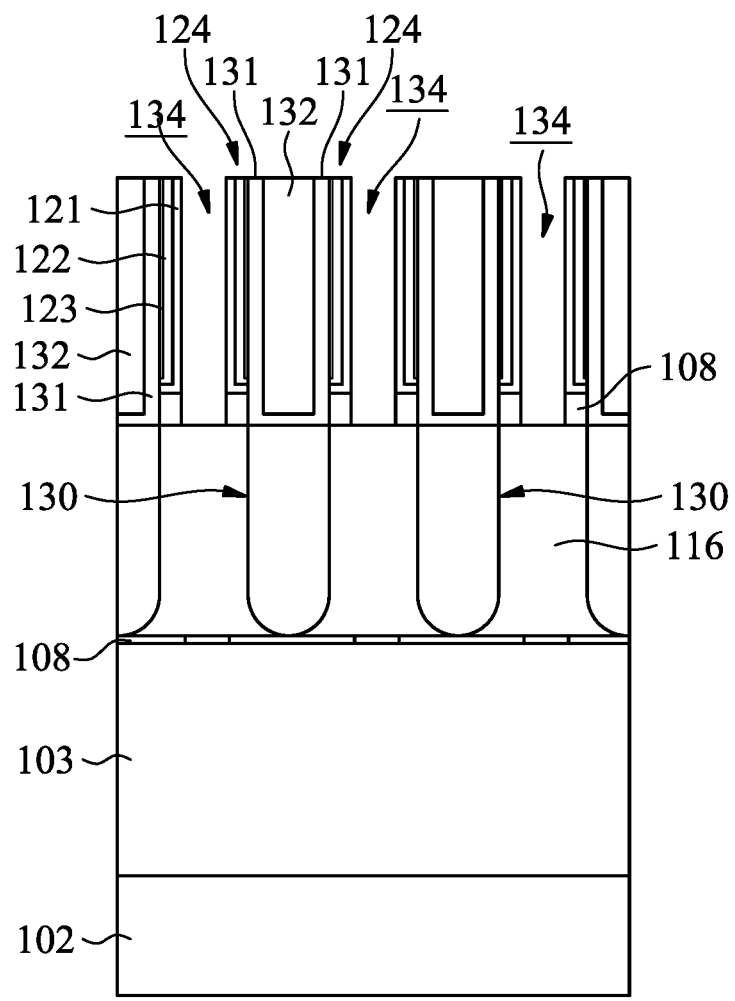

Referring to FIG. 11C, a cross-sectional view of the intermediate structure taken along line C-C in FIG. 1 at this stage of removing the disposable mandrel fin 106 is the same as the intermediate structure of FIG. 10C, in accordance with some embodiments.

Referring to FIG. 11A, also, a cross-sectional view of the intermediate structure taken along line A-A in FIG. 1 at this stage of removing the disposable mandrel fin 106 is the same as the intermediate structure of FIG. 10A, in accordance with some embodiments.

Figure 11D:
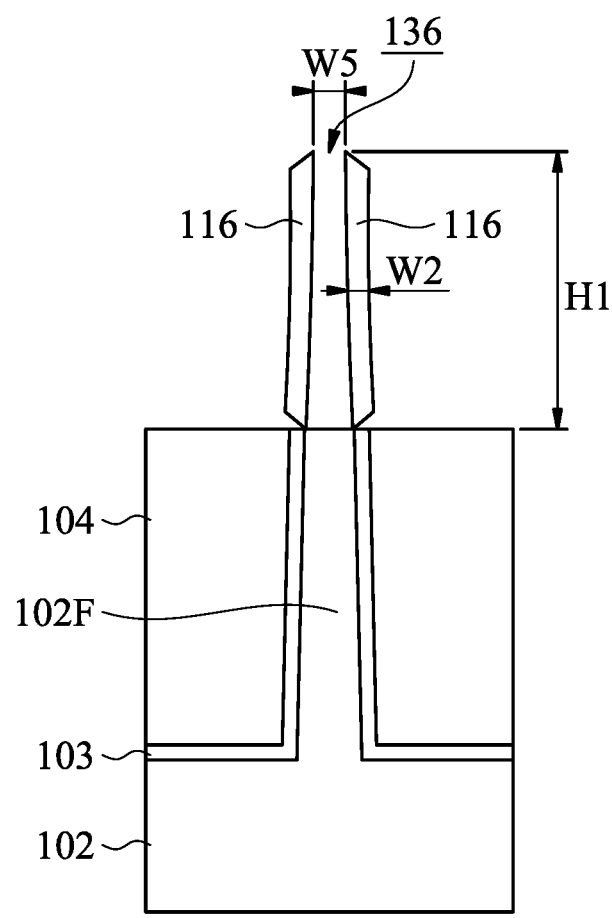

Referring to FIG. 11D, the disposable mandrel fin 106 of FIG. 10D is removed in the etching process of FIG. 11B to form the space 136, in accordance with some embodiments.

The space 136 is formed between the channel fins 116. The channel fins 116 have an etch selectivity that is lower than the disposable mandrel fin 106. Therefore, the channel fins 116 can be used as an etch stop layer in the etching process for removing the disposable mandrel fin 106 in the intermediate structure of FIG. 11D. The space 136 between the channel fins 116 may be referred to as a fin-to-fin space and has an average, width W5. In some examples, the average width W5 is in a range from about 5 nm to about 12 nm. The channel fins 116 have a width W2 that is in a range from about 5 nm to about 10 nm. The channel fins 116 have a height H1 that is in a range from about 30 nm to about 60 nm.

Figure 12A:
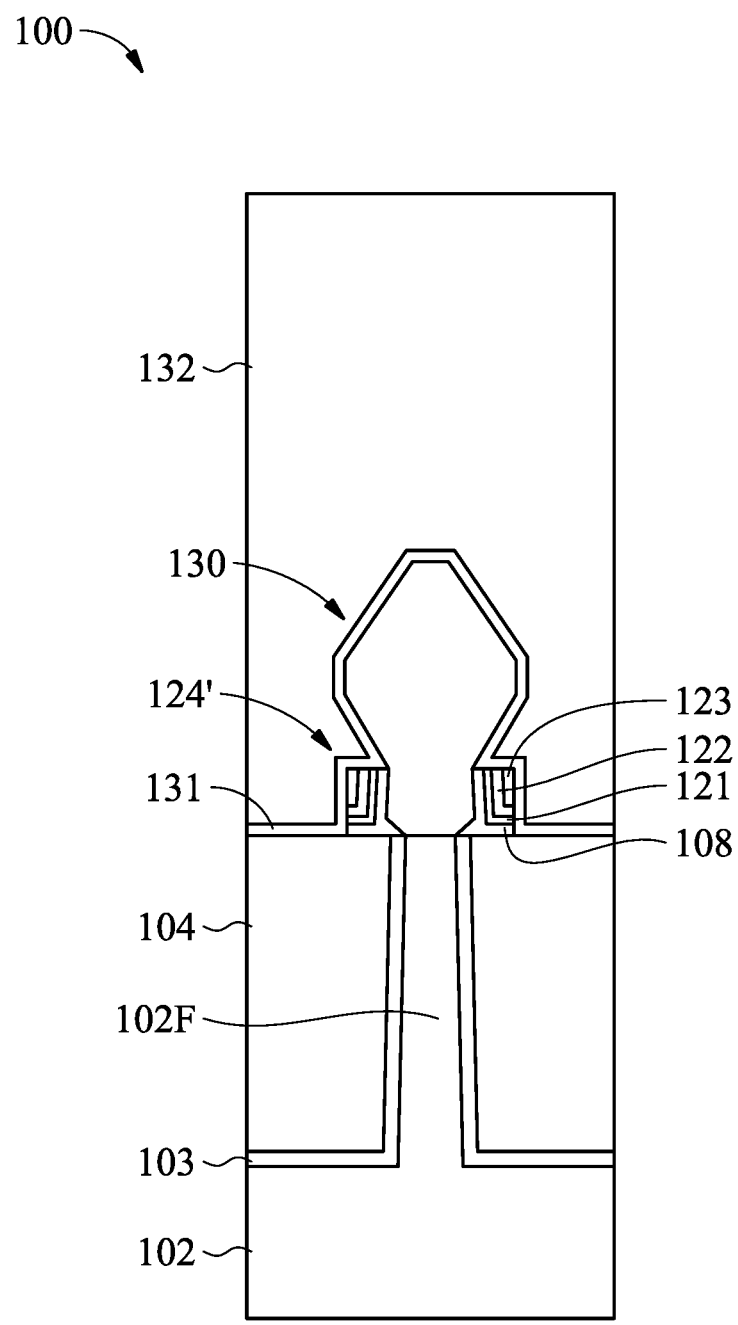
Figure 12B:
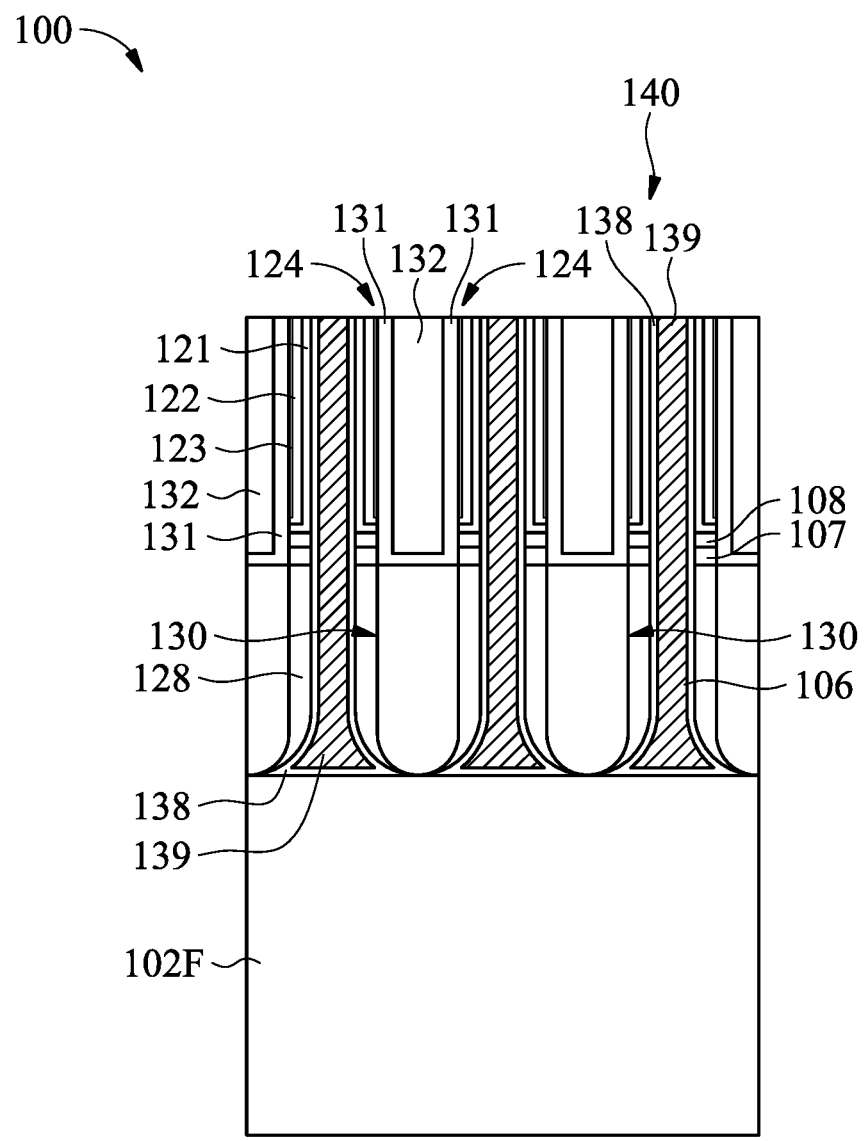

FIGS. 12A, 12B, 12C and 12D illustrate cross-sectional views of a semiconductor device 100 following FIGS. 11A-11D, which are taken along line A-A, line B-B, line C-C and line D-D in FIG. 1, respectively, in accordance with some embodiments. Referring to FIG. 12B, replacement gate structures 140 are formed in the spaces 136 and the trenches 134 of FIG. 11B, in accordance with some embodiments. The replacement gate structure 140 includes a gate dielectric layer 138 and a gate electrode layer 139. The gate dielectric layer 138 may be a high-k gate dielectric layer, and the gate electrode layer 139 may be a metal gate electrode layer. The gate dielectric layer 138 is conformally deposited on the sidewalls of the gate spacers 124, on the sidewalls of the channel recovered features 128 and on the top surface of the fin 102F that is exposed through the spaces 136. The gate electrode layer 139 is formed on the gate dielectric layer 138.

Figure 12D:
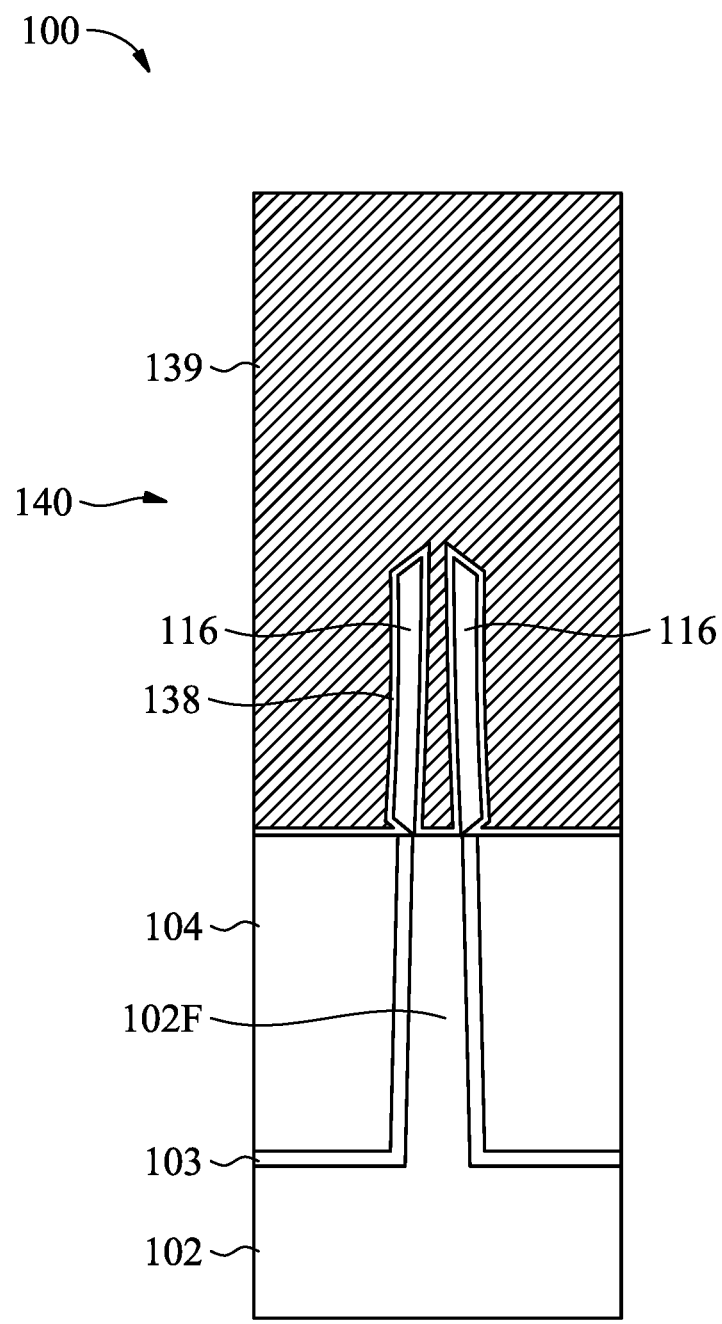
Figure 13:
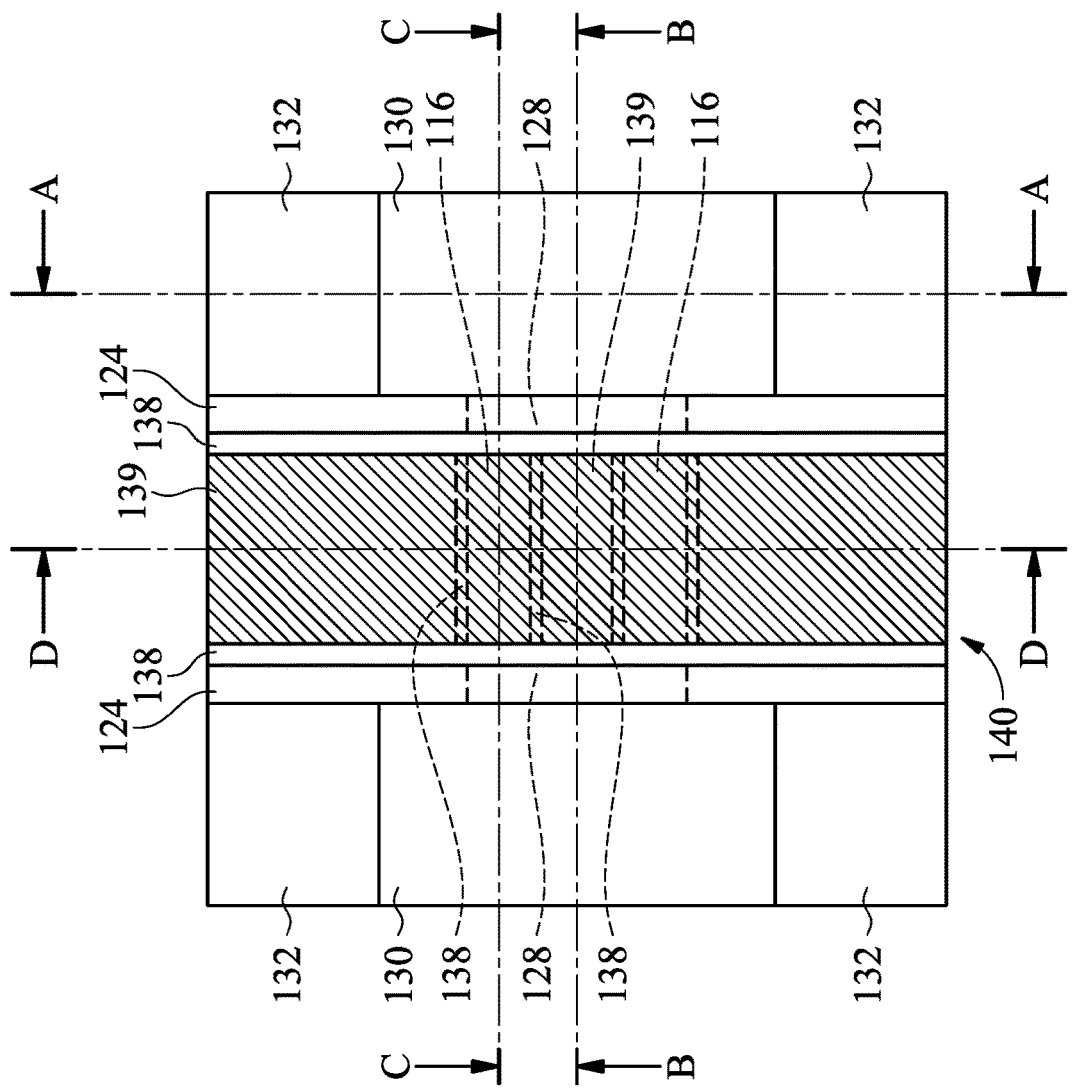
FIG. 13 shows a top view of a portion of the semiconductor device of FIGS. 12A-12D, in accordance with some embodiments.

In the structure of FIG. 12B, the bottom surfaces of the replacement gate structure 140, the channel recovered features 128 and the epitaxial source and drain structure 130 are on the same plane over the fin 102F. In addition, an upper portion of the replacement gate structure 140 in the trench 134 is connected to a lower portion of the replacement gate structure 140 in the space 136 between the channel recovered features 128 and the channel fins 116 (FIG. 12D). Moreover, the gate spacers 124 are disposed on upper sidewalls of the replacement gate structure 140. The channel recovered features 128 are disposed directly under the gate spacers 124 and on lower sidewalls of the replacement gate structure 140. The channel recovered features 128 and the channel fins 116 form a ring to surround a portion of the replacement gate structure 140 (FIG. 13).

The gate dielectric layer 138 includes silicon oxide, silicon nitride, a high-k dielectric material, multilayers thereof, or other dielectric material. The high-k dielectric material may have a k-value greater than about 7.0. The high-k dielectric material may include a metal oxide of or a metal silicate of Hf, Al, Zr, La, Mg, Ba, Ti, Pb, or a combination thereof. The gate dielectric layer 138 may be deposited by ALD, PECVD, molecular-beam deposition (MBD), or another deposition process. In some examples, the gate dielectric layer 138 has a thickness in a range from about 15 Å to about 25 Å.

The gate electrode layer 139 is formed over the gate dielectric layer 138. In some embodiments, the gate electrode layer 139 includes multiple layers, such as a capping layer, a barrier layer, a work-function tuning layer and a metal fill material. The capping layer, the barrier layer and the work-function tuning layer are conformally deposited over the gate dielectric laser 138 in sequence.

The capping layer may include titanium nitride, titanium-silicon nitride, titanium-carbon nitride, titanium-aluminum nitride, tantalum nitride, tantalum-silicon nitride, tantalum-carbon nitride, aluminum nitride, or a combination thereof, and may be deposited by ALD, PECVD, MBD, or another deposition process. In some examples, the capping layer may have a thickness in a range from about 5 Å to about 25 Å.

The barrier layer may include tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof, and may be deposited by ALD, PECVD, MBD, or another deposition process. In some examples, the barrier layer may have a thickness in a range from about 5 Å to about 25 Å.

The work-function tuning layer may include titanium aluminum carbide (TiAlC), a titanium aluminum alloy (TiAl), tantalum-aluminum carbide, or a combination thereof, and may be deposited by ALD, PECVD, MBD, or another deposition process. In some examples, the work-function tuning layer may have a thickness in a range from about 10 Å to about 60 Å. Other examples may have various other configurations of work-function tuning layers to achieve a desired performance of the FinFET to be formed. For example, any different number of work-function layers having various materials and/or thicknesses may be used. In some instances, for example, a p-type FinFET and an n-type FinFET may have different work-function tuning layers.

The metal fill material is deposited to fill the remaining space over the work-function tuning layer. The metal fill material may include tungsten, cobalt, ruthenium, aluminum, copper, multi-layers thereof, or a combination thereof. The metal fill material may be deposited by ALD, PECVD, MBD, PVD, or another deposition process.

Moreover, excess portions of the gate dielectric layer 138 and the gate electrode layer 139 deposited on the top surfaces of the ILD layer 132, the CESL 131 and the gate spacers 124 may be removed in a planarization process, such as a CMP process. The result of the planarization process is illustrated as the structures of FIGS. 12A to 12D in accordance with some embodiments. The top surface of the replacement gate structure 140 is coplanar with the top surfaces of the ILD layer 132, the CESL 131 and the gate spacers 124.

Figure 12C:
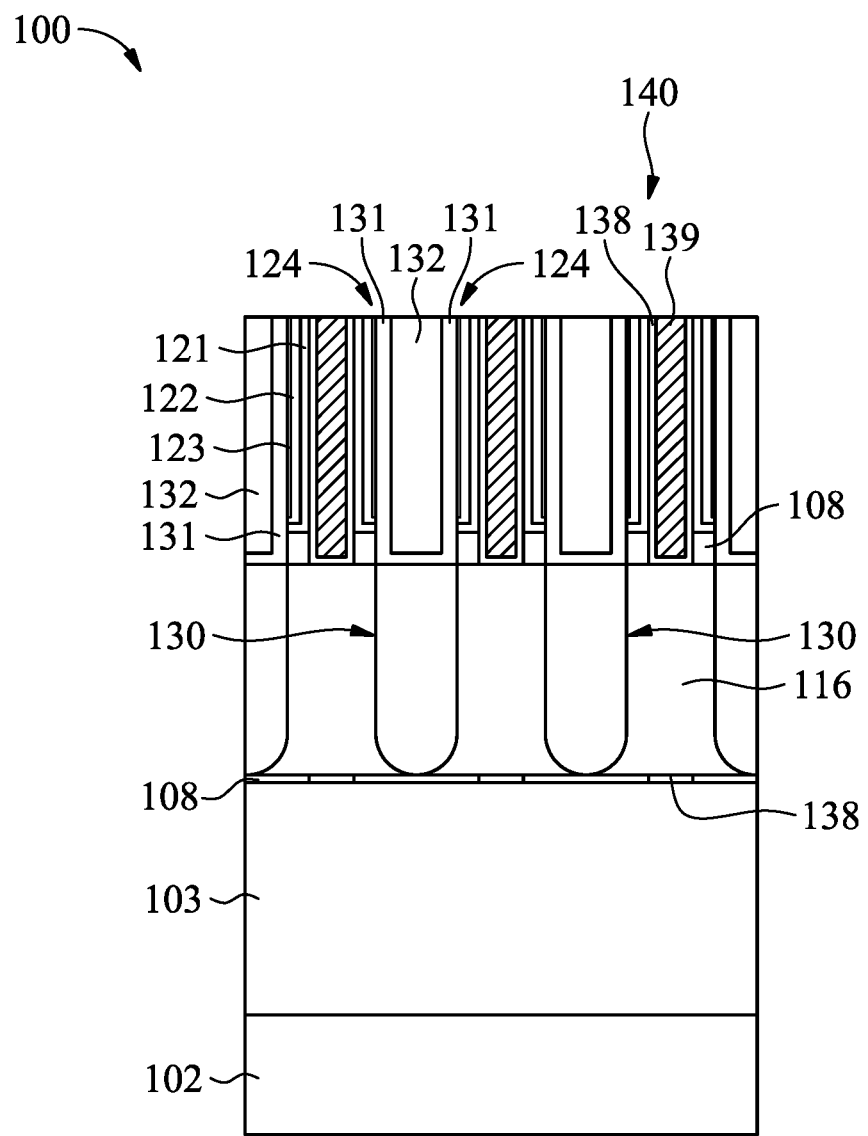

Referring to FIG. 12C, the replacement gate structures 140 are formed in the trenches 134 of FIG. 11C, in accordance with some embodiments. The replacement gate structure 140 includes the gate dielectric layer 138 and the gate electrode layer 139 those are described above with respect to FIG. 12B. The replacement gate structures 140 are formed on the channel fins 116. In addition, a portion of the gate dielectric layer 138 is formed under the channel fins 116 due to the space between the inclined plane of the channel fins 116 and the liner 103 as shown in FIG. 3A-1 in accordance with some embodiments.

Referring to FIG. 12A, a cross-sectional view of the semiconductor device 100 taken along line A-A in FIG. 1 at this stage of forming the replacement gate structures 140 is the same as the intermediate structure of FIG. 11A, in accordance with some embodiments.

Referring to FIG. 12D, the replacement gate structure 140 is formed to fill the space 136 between the channel fins 116 of FIG. 11D and to wrap the channel fins 116 to be a gate-all-around (GAA) structure, in accordance with some embodiments. The replacement gate structure 140 completely surrounds the channel fins 116 in the semiconductor device 100. Moreover, the replacement gate structure 140 is also formed on the isolation structure 104. The replacement gate structure 140 includes the gate dielectric layer 138 and the gate electrode layer 139 as those described above with respect to FIG. 12B. The gate dielectric layer 138 is conformally deposited on the top surfaces, the outer sidewalls and the inner sidewalls of the channel fins 116. The gate dielectric layer 138 is also conformally deposited on the top surfaces of the liner 103 and the isolation structure 104. The gate electrode layer 139 is formed on the gate dielectric layer 138.

In some embodiments, from the structure of FIG. 3A-2, the buffer portion 105 of the semiconductor devices 100 is disposed between the fin 102F and the replacement gate structure 140. The buffer portion 105 and the isolation structure 104 have a coplanar top surface, and the channel fins 116 are vertically upward from the coplanar top surface.

FIG. 13 shows a top view of a portion of the semiconductor device 100 of FIGS. 12A to 12D, in accordance with some embodiments. FIG. 13 also illustrates reference cross-section line A-A, line B-B, line C-C and line D-D those are used in FIGS. 12A to 12D, respectively. Line A-A is on a plane that is parallel with the replacement gate structure 140 and across the ILD layer 132 and the epitaxial source or drain structure 130. Line B-B is on a plane that is perpendicular to the replacement gate structure 140, across the epitaxial source and drain structures 130, and along the region of the replacement gate structure 140 between the channel fins 116. Line C-C is on a plane that is perpendicular to the replacement gate structure 140, across the epitaxial source and drain structures 130, and along the channel fins 116. Line D-D is on a plane that is along the replacement gate structure 140 and across the channel fins 116.

Referring to FIG. 13, the channel fins 116 and the channel recovered features 128 may form a full ring in a top view to surround a portion of the replacement gate structure 140. The full ring is disposed between the epitaxial source and drain structures 130. In addition, the channel recovered features 128 are disposed directly under the gate spacers 124. The replacement gate structure 140 completely surrounds the channel fins 116 and fills the space between the channel fins 116 to serve as the GAA structure. Moreover, the channel fins 116 are covered with the replacement gate structure 140.

Afterwards, via contacts (not shown) to the epitaxial source and drain structures 130 are formed in the ILD layer 132. The via contacts are formed to pass through the ILD layer 132 and to be in contact with the epitaxial source and drain structures 130, respectively. The via contacts are formed by forming contact holes in the ILD layer 132 using photolithography and etching processes. The epitaxial source and drain structures 130 are exposed through the contact holes.

Thereafter, the contact holes are filled with a conductive material using a depositing process. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include titanium, titanium nitride, tantalum, tantalum nitride, or the like. The liner may be deposited by ALD, PECVD, MBD, PVD, or another deposition technique.

In addition, an anneal process may be performed to facilitate a reaction between some portions of the liner and the epitaxial source and drain structures 130 to form silicide regions at the respective epitaxial source and drain structures 130. The conductive material of the via contacts includes a metal, such as cobalt, tungsten, copper, aluminum, gold, silver, alloys thereof, or a combination thereof, and may be deposited by CVD, ALD, PVD, or another deposition technique.

Next, excess portion of the conductive material over the ILD layer 132 is removed in a planarization process, such as a CMP process. The via contacts are formed to be coplanar with the ILD layer 132, the CESL 131, the gate spacers 124 and the replacement gate structure 140.

Afterwards, another ILD layer (not shown) is formed on the ILD layer 132 and the replacement gate structure 140. A contact to the replacement gate structure 140 is formed in and passes through the upper ILD layer. The contact is in contact with the replacement gate structure 140. The materials and the processes for forming the contact to the replacement gate structure 140 may be the same as or similar to those described above with respect to the via contacts to the epitaxial source and drain structures 130.

According to the embodiments of the disclosure, methods for fabricating the semiconductor devices 100 such as FinFET devices with a gate-all-around (GAA) structure are provided. In some embodiments, the disposable mandrel fin 106 is formed on the fin 102F. The fin 102F protrudes from the semiconductor substrate 102 and is surrounded by the isolation structure 104, for example a shallow-trench-isolation (STI) structure. Multiple channel fins 116 are formed on the sidewalls of the disposable mandrel fin 106 using an epitaxial growth process. The semiconductor material of the channel fins 116 is different from that of the disposable mandrel fin 106. A dummy gate structure 110 is formed on the disposable mandrel fin 106 and on the channel fins 116. Gate spacers 124 are formed on the sidewalls of the dummy gate structure 110. The disposable mandrel fin 106 and the channel fins 116 are etched in an anisotropic etching process by using the dummy gate structure 110 and the gate spacers 124 as an etching mask to form recesses 126 in the source and drain regions 112. Next, the disposable mandrel fin 106 and the channel fins 116 are pulled back in an isotropic etching process to enlarge the recesses 126 to form the recesses 126' in the source and drain regions 112. The recesses 126' in the source and drain regions 112 are pushed back to be directly under the gate spacers 124.

Afterwards, channel recovered features 128 are formed along the sidewalls of the recesses 126' and on the sidewalls of the disposable mandrel fin 106 and the channel fins 116 using an epitaxial re-growth process. Then, epitaxial source and drain structures 130 are formed in the recesses 126'. The ILD layer 132 and the CESL 131 are deposited on the epitaxial source and drain structures 130. Next, the dummy gate structure 110 is removed to form trenches 134 above the disposable mandrel fin 106 and the channel fins 116. Thereafter, the disposable mandrel fin 106 is removed in an etching process to form the space 136 between the channel fins 116. The channel recovered features 128 and the channel fins 116 may be used as an etch stop layer in the etching process for removing the disposable mandrel fin 106. Afterwards, the gate dielectric layer 138 and the gate electrode layer 139 of the replacement gate structure 140 are formed to fill the space 136 between the channel fins 116 and to fill the trench 134 between the gate spacers 124. The gate dielectric layer 138 may be a high-k gate dielectric layer, and the gate electrode layer 139 may be a metal gate electrode layer. As a result, the replacement gate structure 140 completely surrounds the channel fins 116 of the semiconductor device 100 and serves as a GAA structure.

According to the embodiments of the disclosure, the semiconductor devices have a GAA structure that completely surrounds the channel fins 116. The channel fins 116 are disposed vertically on the top surfaces of the fin 102F and the isolation structure 104. Therefore, it is easy for the gate dielectric layer 138 and the gate electrode layer 139 to fill the space 136 between the channel fins 116 and surround the channel fins 116. Accordingly, the processes of forming the GAA structure according to the embodiments of the disclosure are easier than the processes of forming conventional GAA structures.

Moreover, according to the embodiments of the disclosure, a fin-to-fin space such as the space 136 between the channel fins 116 is defined by the width of the disposable mandrel fin 106. The width of the disposable mandrel fin 106 can be controlled by the width of the hard mask 107 thereon and is flexible. Therefore, the fin-to-fin space of the semiconductor devices for the replacement gate structure 140 is flexible. The Vts (threshold voltages) of the semiconductor devices are thereby flexibly controlled. In some instances, the fin-to-fin space may be smaller than about 10 nm. In addition, the width of the channel fins 116 can be controlled by the process time of the epitaxial growth process for the channel fins 116. In some instances, the width of the channel fins 116 may be smaller than about 5 nm without additional trimming process.

Furthermore, according to the embodiments of the disclosure, the process of forming a two-fin epitaxial source or drain merged structure does not require a minimal epitaxial source or drain lateral distance. Therefore, the process window of forming the two-fin epitaxial source or drain merged structure can be enlarged.

According to the benefits mentioned above, the embodiments of the disclosure are suitable for semiconductor devices with GAA structure at multiple technology nodes of 16 nm (N16), N10, N7, N5, N3 and beyond. The semiconductor devices with GAA structure of the disclosure can satisfy the requirements of drain induced barrier lowering (DIBL) and source/drain to bulk leakage for the FinFET devices beyond N5 technology node.

In some embodiments, a semiconductor device is provided. The semiconductor device includes a fin protruding from a substrate and an isolation structure surrounding the fin. The semiconductor device also includes a first channel layer and a second channel layer formed over the fin and at least partially overlapping the isolation structure. The semiconductor device further includes a gate structure formed in a space between the first channel layer and the second channel layer and wrapping around the first channel layer and the second channel layer.

In some embodiments, a semiconductor device is provided. The semiconductor device includes a fin protruding from a substrate and a liner formed over sidewalls of the fin and a top surface of the substrate. The semiconductor device also includes an isolation structure formed over the liner and surrounding the fin and a first channel layer and a second channel layer spaced apart from each other over the fin and the isolation structure. The semiconductor device further includes a gate structure wrapping around the first channel layer and the second channel layer.

In some embodiments, a method of fabricating a semiconductor device is provided. The method includes forming a fin protruding from a substrate and forming channel layers over the fin. The method also includes forming a dummy gate electrode layer over the fin and the channel layers and etching the channel layers and the fin to form a recess. The method further includes forming a source/drain structure in the recess and removing the dummy gate electrode layer. The method includes partially removing the fin to form a space between the channel layers and forming a gate structure in the space between the channel layers and around the channel layers.

In some embodiments, a method of fabricating a semiconductor device is provided. The method includes forming a fin protruding from a substrate, and forming a disposable mandrel fin on the fin. The method also includes epitaxially growing channel fins on sidewalls of the disposable mandrel fin. The method further includes removing the disposable mandrel fin to form a space between e channel fins, and forming a gate structure to fill the space between the channel fins and to wrap the channel fins. In addition, the method includes forming source and drain structures on opposite sides of the gate structure.

In some embodiments, a method of fabricating a semiconductor device is provided. The method includes forming a fin protruding from a substrate, and forming an isolation structure to surround the fin, in which the isolation structure and the fin have a coplanar top surface. The method also includes forming a disposable mandrel fin on the coplanar top surface, and epitaxially growing channel fins on sidewalls of the disposable mandrel fin. The method further includes etching the disposable mandrel fin and the channel fins to form recesses and forming source and drain structures in the recesses. In addition, the method includes removing the disposable mandrel fin to form a space between the channel fins, and forming a replacement gate structure to fill the space between the channel fins and to surround the channel fins.

In some embodiments, a semiconductor device is provided. The semiconductor device includes a fin protruding from a semiconductor substrate, and an isolation structure surrounding the fin. The semiconductor device also includes channel fins vertically disposed on the fin and the isolation structure. The semiconductor device further includes a gate structure filling a space between the channel fins and surrounding the channel fins. In addition, the semiconductor device includes source and drain structures disposed on opposite sides of the gate structure.

In some embodiments, a method of fabricating a semiconductor device is provided. The method includes forming a fin protruding from a substrate and forming channel fins on sidewalls of the fin. The method also includes recessing the fin in a first region to form a space between the channel fins and forming a gate structure to fill the space between the channel fins and to wrap the channel fins.

In some embodiments, a method of fabricating a semiconductor device is provided. The method includes forming a fin protruding from a substrate and forming an isolation structure surrounding the fin. The method also includes epitaxially growing channel fins on sidewalls of the fin over the isolation structure and etching the fin to form a space between the channel fins. The method further includes forming a gate structure to fill the space between the channel fins.

In some embodiments, a semiconductor device is provided. The semiconductor device includes a fin protruding from a semiconductor substrate and an isolation structure surrounding the fin. The semiconductor device also includes a first channel fin and a second channel fin formed over two opposite sides of the fin and overlapping the isolation structure and a gate structure filling a space between the first channel fin and the second channel fin and wrapping around the first channel fin and the second channel fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin protruding from a substrate;
   an isolation structure surrounding the fin;
   a first channel layer and a second channel layer formed over the fin and at least partially overlapping the isolation structure; and
   a gate structure formed in a space between the first channel layer and the second channel layer and wrapping around the first channel layer and the second channel layer.

2. The semiconductor structure as claimed in claim 1, wherein a thickness of the first channel layer is greater than a width of the first channel layer.

3. The semiconductor structure as claimed in claim 1, further comprising:
   a source/drain structure formed over the fin; and
   spacers formed at opposite sides of the source/drain structure,
   wherein a portion of the source/drain structure vertically overlaps the spacers.

4. The semiconductor structure as claimed in claim 3, wherein a top surface of the source/drain structure is higher than top surfaces of the spacers.

5. The semiconductor structure as claimed in claim 1, wherein the first channel layer has an unlevel top surface.

6. The semiconductor structure as claimed in claim 5, wherein the first channel layer has an unlevel bottom surface.

7. A semiconductor structure, comprising:
   a fin protruding from a substrate;
   an isolation structure surrounding the fin;
   a first channel layer and a second channel layer spaced apart from each other over the fin and the isolation structure; and
   a gate structure wrapping around the first channel layer and the second channel layer.

8. The semiconductor structure as claimed in claim 7, further comprising:
   a liner formed over sidewalls of the fin and a top surface of the substrate,
   wherein a portion of the gate structure is sandwiched between the liner and the first channel layer.

9. The semiconductor structure as claimed in claim 7, wherein the first channel layer and the second channel layer are laterally aligned with each other.

10. The semiconductor structure as claimed in claim 7, further comprising:
    an isolation fin formed in the isolation structure,
    wherein a bottom surface of the isolation fin is lower than a top surface of the isolation structure, and a top surface of the isolation fin is higher than the top surface of the isolation structure.

11. The semiconductor structure as claimed in claim 7, further comprising:
    a source/drain structure formed over the fin;
    a dummy gate dielectric layer covering a bottom portion of the source/drain structure; and
    a spacer formed over the dummy gate dielectric layer.

12. The semiconductor structure as claimed in claim 11, wherein a portion of the dummy gate dielectric layer extends between the source/drain structure.

13. A semiconductor structure, comprising:
    a fin protruding from a substrate;
    an isolation structure surrounding the fin;
    a first channel layer and a second channel layer formed over the fin, wherein the first channel layer has a first sidewall surface, a second sidewall surface opposite to the first sidewall surface, and a third sidewall surface and a fourth sidewall surface connecting the first sidewall surface and the second sidewall surface, and the second channel layer has a fifth sidewall surface, a sixth sidewall surface opposite to the fifth sidewall surface, and a seventh sidewall surface and an eighth sidewall surface connecting the fifth sidewall surface and the sixth sidewall surface;
    a gate structure formed in a space between the first sidewall surface of the first channel layer and the fifth sidewall surface of the second channel layer and in direct contact with the first sidewall surface, the second sidewall surface, the third sidewall surface, and the fourth sidewall surface of the first channel layer and the fifth sidewall surface, the sixth sidewall surface, the seventh sidewall surface, and the eighth sidewall surface of the second channel layer.

14. The semiconductor structure as claimed in claim 13, wherein the fin protruding from the substrate along a first direction, and the first channel layer and the second channel layer are spaced apart from each other along a second direction different from the first direction.

15. The semiconductor structure as claimed in claim 14, wherein a dimension of the first sidewall surface in the first direction is different from a dimension of the second sidewall surface in the first direction.

16. The semiconductor structure as claimed in claim 15, wherein the dimension of the first sidewall surface in the first direction is greater than the dimension of the second sidewall surface in the first direction.

17. The semiconductor structure as claimed in claim 14, wherein a dimension of the first channel layer in the first direction is greater than a dimension of the first channel layer in the second direction.

18. The semiconductor structure as claimed in claim 13, wherein the third sidewall surface is not parallel to the fourth sidewall surface.

19. The semiconductor structure as claimed in claim 13, wherein the first sidewall surface is in contact with a top surface of the fin.

20. The semiconductor structure as claimed in claim 19, wherein the first sidewall surface vertically overlaps the isolation structure and is spaced apart from the isolation structure.

* * * * *